(12) United States Patent
Fedoruk et al.

(10) Patent No.: US 12,282,719 B1
(45) Date of Patent: Apr. 22, 2025

(54) BUILDING AND SIMULATING EXECUTION OF MANAGED ARTIFICIAL INTELLIGENCE PIPELINES

(71) Applicant: Airia LLC, Alpharetta, GA (US)

(72) Inventors: Roman Fedoruk, Cumming, GA (US); John Manton, Alpharetta, GA (US); Spencer Reagan, Marietta, GA (US); Gregory Roberts, Alpharetta, GA (US); Erich Stuntebeck, Johns Creek, GA (US)

(73) Assignee: Airia LLC, Alpharetta, GA (US)

( * ) Notice: Subject to any disclaimer, the term of this patent is extended or adjusted under 35 U.S.C. 154(b) by 0 days.

(21) Appl. No.: 18/775,938

(22) Filed: Jul. 17, 2024

Related U.S. Application Data

(60) Provisional application No. 63/658,434, filed on Jun. 10, 2024, provisional application No. 63/650,487, filed on May 22, 2024.

(51) Int. Cl.
*G06F 30/27* (2020.01)
(52) U.S. Cl.
CPC ................... *G06F 30/27* (2020.01)
(58) Field of Classification Search
CPC ........................................ G06F 20/37
See application file for complete search history.

(56) References Cited

U.S. PATENT DOCUMENTS

| | | | |
|---|---|---|---|
| 9,495,133 B1 | 11/2016 | Righi et al. | |
| 9,811,074 B1 * | 11/2017 | Aichele | B25J 9/1656 |
| 9,823,950 B1 * | 11/2017 | Carrier | G06F 9/543 |
| 10,643,144 B2 * | 5/2020 | Bowers | G06N 20/00 |
| 10,824,703 B1 * | 11/2020 | Desai | G06V 40/70 |
| 10,902,705 B1 * | 1/2021 | Rose | H04L 63/0823 |
| 10,983,904 B1 * | 4/2021 | Sundararaman | G06F 11/3684 |
| 11,074,107 B1 * | 7/2021 | Nandakumar | G06F 8/10 |
| 11,113,470 B2 * | 9/2021 | Nelson | G06F 40/30 |

(Continued)

FOREIGN PATENT DOCUMENTS

| | | |
|---|---|---|
| CN | 115374515 A | 11/2022 |
| WO | 2019053488 A1 | 3/2019 |

OTHER PUBLICATIONS

Desfeux et al., Identification of a Series of Compatible Components using Artificial Intelligence, 2019, World Intellectual PropertyOrganization Patent Cooperation Treaty (PCT), pp. 1-34 (Year: 2019), In consideration of WO 2019053488.

(Continued)

*Primary Examiner* — Charles L Beard
(74) *Attorney, Agent, or Firm* — Clayton, McKay & Bailey, PC

(57) ABSTRACT

Systems and methods are described for building artificial intelligence ("AI") pipelines. A user interface (UI) includes selectable pipeline objects, such as a dataset and an AI model, that a user can position and connect on the screen. This causes execution linking between the selected pipeline objects, with the execution linking being visually displayed in the UI. A management policy can be applied to the pipeline, including user or device requirements for accessing the dataset in the pipeline. Then the UI can present a simulated execution of the AI pipeline, in which a test query is input and the pipeline objects execute in an order displayed in the UI. The pipeline can then be deployed for access at an endpoint.

20 Claims, 18 Drawing Sheets

(56) References Cited

U.S. PATENT DOCUMENTS

| | | | |
|---|---|---|---|
| 11,119,985 B1* | 9/2021 | Alagianambi | G06F 9/541 |
| 11,636,401 B2* | 4/2023 | Dhingra | G06N 5/04 |
| | | | 706/12 |
| 11,734,027 B2* | 8/2023 | Katahanas | G06F 16/93 |
| | | | 715/753 |
| 11,748,634 B1* | 9/2023 | Kulkarni | G06F 18/21 |
| | | | 707/722 |
| 11,922,153 B2* | 3/2024 | Jones | G06F 9/463 |
| 11,989,537 B2* | 5/2024 | de Jong | G06F 11/3466 |
| 12,086,153 B1* | 9/2024 | Kannan | G06F 16/213 |
| 12,118,338 B1* | 10/2024 | Benamu | G06F 8/4452 |
| 12,131,233 B1* | 10/2024 | Kulkarni | G06F 16/245 |
| 2008/0281768 A1* | 11/2008 | Sadeh | G06Q 10/10 |
| | | | 706/47 |
| 2010/0138368 A1* | 6/2010 | Stundner | G06N 20/00 |
| | | | 706/47 |
| 2011/0161920 A1* | 6/2011 | Alexander | G06F 8/34 |
| | | | 717/105 |
| 2011/0213712 A1 | 9/2011 | Hadar et al. | |
| 2014/0170606 A1* | 6/2014 | Chong | G06F 8/436 |
| | | | 434/118 |
| 2014/0287397 A1* | 9/2014 | Chong | G09B 5/12 |
| | | | 434/350 |
| 2015/0199010 A1* | 7/2015 | Coleman | A61B 5/0022 |
| | | | 345/156 |
| 2015/0277900 A1* | 10/2015 | O'Keeffe | G06F 8/34 |
| | | | 717/113 |
| 2015/0277901 A1* | 10/2015 | Karle | G06F 11/3688 |
| | | | 717/120 |
| 2015/0309695 A1* | 10/2015 | Sannandeji | G06F 8/34 |
| | | | 715/763 |
| 2016/0063512 A1* | 3/2016 | Greenspan | G06F 11/3006 |
| | | | 705/7.29 |
| 2016/0092178 A1* | 3/2016 | Geng | G06F 8/427 |
| | | | 717/104 |
| 2016/0103659 A1* | 4/2016 | Tijanic | G06F 8/34 |
| | | | 717/115 |
| 2016/0358099 A1* | 12/2016 | Sturlaugson | G06N 5/043 |
| 2018/0052861 A1* | 2/2018 | Seetharaman | G06N 5/04 |
| 2018/0089582 A1* | 3/2018 | Bouillet | G06N 20/20 |
| 2018/0152564 A1 | 5/2018 | Lang et al. | |
| 2018/0268244 A1* | 9/2018 | Moazzami | G06V 20/176 |
| 2018/0314971 A1 | 11/2018 | Chen et al. | |
| 2018/0349527 A1* | 12/2018 | Li | G06N 3/08 |
| 2019/0079643 A1* | 3/2019 | Kershaw | G06Q 10/101 |
| 2019/0206390 A1* | 7/2019 | Rotem | G06N 3/048 |
| 2019/0311095 A1* | 10/2019 | Paeschke | G06F 21/316 |
| 2019/0384461 A1* | 12/2019 | Seif | G06F 3/0484 |
| 2019/0384577 A1* | 12/2019 | Seif | G06F 8/22 |
| 2019/0384615 A1* | 12/2019 | Kernert | G06F 16/13 |
| 2019/0384635 A1* | 12/2019 | Seif | G06F 9/5083 |
| 2019/0384659 A1* | 12/2019 | Johannsen | G06F 9/542 |
| 2020/0151588 A1* | 5/2020 | Doan Huu | G06N 20/00 |
| 2020/0242279 A1* | 7/2020 | Malkosh | G06Q 30/0621 |
| 2020/0257567 A1 | 8/2020 | Fontanari Filho et al. | |
| 2020/0264437 A1* | 8/2020 | Kobayashi | G06F 3/013 |
| 2020/0265509 A1 | 8/2020 | Kumar Addepalli et al. | |
| 2020/0294201 A1* | 9/2020 | Planche | G06F 18/2413 |
| 2020/0349469 A1* | 11/2020 | Katzenberger | G06F 16/24568 |
| 2020/0379755 A1* | 12/2020 | Boada | G06F 40/232 |
| 2021/0081819 A1* | 3/2021 | Polleri | G06N 3/006 |
| 2021/0081837 A1* | 3/2021 | Polleri | G06N 5/022 |
| 2021/0081841 A1* | 3/2021 | Sikka | G06N 3/045 |
| 2021/0081848 A1* | 3/2021 | Polleri | G06F 11/3409 |
| 2021/0117868 A1* | 4/2021 | Sriharsha | G06N 20/20 |
| 2021/0150411 A1* | 5/2021 | Coenders | G06F 21/53 |
| 2021/0192111 A1* | 6/2021 | Hoyer | G06F 30/13 |
| 2021/0241170 A1* | 8/2021 | Sarferaz | G06N 20/00 |
| 2021/0312276 A1* | 10/2021 | Rawat | G06F 18/24143 |
| 2021/0326736 A1* | 10/2021 | Kishimoto | G06F 18/217 |
| 2021/0342738 A1* | 11/2021 | Sarferaz | G06Q 10/10 |
| 2022/0004914 A1* | 1/2022 | Kirchner | G06F 8/76 |
| 2022/0036232 A1* | 2/2022 | Patel | G06F 8/71 |
| 2022/0038490 A1* | 2/2022 | Thakur | G06N 3/045 |
| 2022/0051049 A1* | 2/2022 | Wang | G06N 20/10 |
| 2022/0051112 A1* | 2/2022 | Wang | G06N 5/022 |
| 2022/0066905 A1* | 3/2022 | Lee | G06V 10/32 |
| 2022/0067181 A1* | 3/2022 | Carley | H04L 9/0618 |
| 2022/0067199 A1* | 3/2022 | Taber | G06F 21/6254 |
| 2022/0121988 A1* | 4/2022 | Margineantu | G06N 20/10 |
| 2022/0129786 A1* | 4/2022 | da Silva | G06N 3/098 |
| 2022/0138004 A1* | 5/2022 | Nandakumar | G06N 5/01 |
| | | | 718/102 |
| 2022/0188691 A1* | 6/2022 | Katz | G06N 20/00 |
| 2022/0207163 A1* | 6/2022 | Gentleman | G06F 21/62 |
| 2022/0229636 A1* | 7/2022 | Nayak | G06N 20/00 |
| 2022/0275610 A1* | 9/2022 | Bohorquez Arevalo | |
| | | | E03B 7/071 |
| 2022/0300850 A1* | 9/2022 | Mendez | G06F 8/34 |
| 2022/0308903 A1* | 9/2022 | Chakraborty | G06F 3/04817 |
| 2022/0309337 A1* | 9/2022 | Copty | G06F 8/77 |
| 2022/0329594 A1* | 10/2022 | Fan | H04L 67/60 |
| 2022/0343020 A1* | 10/2022 | Farre Guiu | G06N 3/096 |
| 2022/0374457 A1* | 11/2022 | Parkhe | G06F 30/27 |
| 2022/0384057 A1* | 12/2022 | Gopalakrishnan | G16H 50/80 |
| 2022/0414530 A1* | 12/2022 | Cmielowski | G06N 20/00 |
| 2023/0022775 A1* | 1/2023 | Soenksen Martinez | |
| | | | C12N 15/1089 |
| 2023/0059857 A1* | 2/2023 | Dolby | G06F 11/0793 |
| 2023/0108560 A1* | 4/2023 | Wang | G06F 3/04817 |
| | | | 717/109 |
| 2023/0114013 A1* | 4/2023 | Marinescu | G06N 20/00 |
| | | | 706/12 |
| 2023/0129665 A1* | 4/2023 | Kumar | G06F 18/2148 |
| | | | 706/12 |
| 2023/0177388 A1* | 6/2023 | Cornec | G06N 20/00 |
| | | | 706/11 |
| 2023/0229976 A1* | 7/2023 | Cheng | G06N 5/01 |
| | | | 706/12 |
| 2023/0230351 A1* | 7/2023 | Abdollahian | G06N 3/084 |
| | | | 382/177 |
| 2023/0244968 A1* | 8/2023 | Gurin | G06N 3/0475 |
| | | | 706/11 |
| 2023/0259817 A1* | 8/2023 | Grayson | G06F 11/323 |
| | | | 706/12 |
| 2023/0289148 A1* | 9/2023 | Wang | G06F 8/34 |
| 2023/0289444 A1* | 9/2023 | Ermey | G06F 21/552 |
| 2023/0297863 A1* | 9/2023 | Chen | G06N 7/01 |
| | | | 706/12 |
| 2023/0306859 A1* | 9/2023 | Foias | G09B 5/02 |
| 2023/0316123 A1* | 10/2023 | Liu | G06F 16/2457 |
| | | | 706/12 |
| 2023/0342623 A1* | 10/2023 | Grayson | G06N 3/08 |
| 2023/0351049 A1* | 11/2023 | Annau | G06F 21/64 |
| 2023/0359746 A1* | 11/2023 | Wang | G06F 21/577 |
| 2023/0368078 A1* | 11/2023 | Arpit | G06F 18/217 |
| 2023/0368773 A1* | 11/2023 | Mishra | G06F 3/167 |
| 2023/0376296 A1* | 11/2023 | Nomula | G06F 8/71 |
| 2023/0384746 A1* | 11/2023 | Reynolds | G05B 17/02 |
| 2023/0409654 A1* | 12/2023 | Ziv | G06N 20/00 |
| 2023/0418243 A1* | 12/2023 | Reynolds | G06F 8/34 |
| 2023/0419168 A1* | 12/2023 | Reynolds | G06F 18/2178 |
| 2024/0019853 A1* | 1/2024 | Reynolds | H04L 63/1425 |
| 2024/0031387 A1* | 1/2024 | Reynolds | H04L 63/1425 |
| 2024/0046041 A1* | 2/2024 | Damo | G06N 5/01 |
| 2024/0061883 A1* | 2/2024 | Vadapandeshwara | |
| | | | G06F 16/9024 |
| 2024/0062044 A1* | 2/2024 | Subramanian | G06F 40/58 |
| 2024/0089256 A1* | 3/2024 | Landy | H04L 63/107 |
| 2024/0095397 A1* | 3/2024 | Knuesel | G06F 21/6245 |
| 2024/0095463 A1* | 3/2024 | Leary | G06F 40/20 |
| 2024/0104394 A1* | 3/2024 | Skerry-Ryan | G06N 3/08 |
| 2024/0119364 A1* | 4/2024 | Jain | G06N 20/00 |
| 2024/0135198 A1* | 4/2024 | Ranganathan | G06N 20/00 |
| 2024/0143343 A1* | 5/2024 | Hamlin | G06N 20/00 |
| 2024/0161015 A1* | 5/2024 | Patel | G06N 20/20 |
| 2024/0168855 A1* | 5/2024 | Lopes | G06N 20/00 |
| 2024/0201957 A1* | 6/2024 | Chaurasia | G06F 8/36 |
| 2024/0202458 A1* | 6/2024 | Zha | G06F 40/279 |
| 2024/0202466 A1* | 6/2024 | Zha | G06N 20/00 |
| 2024/0256241 A1* | 8/2024 | Dakkak | G06F 8/52 |
| 2024/0256520 A1* | 8/2024 | Rapowitz | G06F 16/2365 |

(56) References Cited

U.S. PATENT DOCUMENTS

| | | | | |
|---|---|---|---|---|
| 2024/0273398 | A1* | 8/2024 | Acharya | G06N 20/00 |
| 2024/0281419 | A1* | 8/2024 | Alfaras | G06F 16/215 |
| 2024/0281429 | A1* | 8/2024 | Subramanian | G06F 16/212 |
| 2024/0289261 | A1* | 8/2024 | Walker | G06F 11/3698 |
| 2024/0296522 | A1* | 9/2024 | Saito | G06V 10/764 |
| 2024/0303470 | A1* | 9/2024 | Wang | G06N 3/08 |
| 2024/0311453 | A1* | 9/2024 | Berry | G06F 21/31 |
| 2024/0319976 | A1* | 9/2024 | Benamu | G06F 21/577 |
| 2024/0362352 | A1* | 10/2024 | Carao | G06F 21/6218 |
| 2024/0378196 | A1* | 11/2024 | Lester | G06N 20/00 |
| 2024/0378653 | A1* | 11/2024 | Christiansen | G06Q 30/0629 |

OTHER PUBLICATIONS

Ding et al, "Hybrid LLM: Cost-Efficient and Quality-Aware Query Routing", arXiv preprint arXiv:2404.14618 (Apr. 2024). (Year: 2024).

Geronimo, "Evaluating LLMs with Semantic Similarity," Mar. 2024 [retrieved on Nov. 30, 2024], pp. 1-39, downloaded from :https://medium.com/@geronimo7/semscore-evaluating-llms-with-semantic-similarity-2abf5c2fadb9. (Year: 2024).

Hazelwood et al., "Applied Machine Learning at Facebook: A Datacenter Infrastructure Perspective," 2018 IEEE International Symposium on High Performance Computer Architecture (H PCA), Vienna, Austria, 2018, pp. 620-629, doi: 0.1109/H PCA.2018.00059 (Year: 2018).

Lin et al., A Pipeline Design Method for Domestic Design(translation), 2022, Chinese Patent Office, pp. 1-8 (Year: 2022), In consideration of CN 115374515.

Lins et al, "Artificial Intelligence as a Service", Bus Inf Syst Eng 63, 441-456 (2021 ). https://doi .org/10.1007 /s12599-021-00708-w (Year: 2021).

Niknazar et al. "Building a domain-specific guardrail model in production." arXiv preprint arXiv:2408.01452 (Jul. 2024). (Year: 2024).

* cited by examiner

BUILDING AND SIMULATING EXECUTION OF MANAGED ARTIFICIAL INTELLIGENCE PIPELINES

CROSS-REFERENCE TO RELATED APPLICATIONS

This application claims priority as a non-provisional application to U.S. provisional application No. 63/658,434, titled "Artificial Intelligence Pipeline Platform," filed on Jun. 10, 2024, the contents of which are incorporated herein in their entirety. This application also claims priority as a non-provisional application to U.S. provisional application No. 65/546,801, filed May 15, 2024, and to U.S. provisional application No. 63/650,487, filed May 22, 2024, both of which are incorporated herein in their entirety.

BACKGROUND

Machine learning (ML) and artificial intelligence (AI) can be used to discover trends, patterns, relationships, and/or other attributes related to large sets of complex, interconnected, and/or multidimensional data. To glean insights from large data sets, regression models, artificial neural networks, support vector machines, decision trees, naïve Bayes classifiers, and/or other types of AI models can be trained using input-output pairs in the data sets. In turn, the trained AI models can be used to guide decisions and/or perform actions related to new data.

When writing program code for utilizing trained ML models, designers oftentimes rely on one or more programming libraries that expose various tools for facilitating the use of trained AI and ML models and the overall coding process. One drawback of relying on these types of programming libraries is that complex software stacks that are difficult to understand and master usually have to be installed and executed to use the programming libraries. Accordingly, many individuals are incapable of writing program code using programming libraries to utilize AI models.

Another drawback of writing program code for using AI models is that new and more powerful models are rapidly being developed. Accordingly, the written program code may need to be repeatedly re-written to make use of newer and more powerful ML models. Currently, there are few, if any, good ways to avoid re-writing program code to take advantage of newer and more powerful AI models. Likewise, the models have different usage and cost parameters, and there is no way to effectively manage who in an enterprise gets to use which model version, and how often. Additionally, datasets may contain information that only some users are allowed to access, and that can be sent to only some models due to security concerns.

These problems are compounded when a company needs to use various datasets and models together. There is no easy way to design and test a pipeline with multiple such stages. Currently, no technology exists for dynamically managing who can access which datasets and models. Likewise, updating and deploying any such pipeline would be convoluted with current technologies.

As the foregoing illustrates, what is needed in the art are more effective systems for design.

SUMMARY

Examples described herein include systems and methods for building AI pipelines with management policies. These pipelines can consist of multiple pipeline objects, including one or more datasets, language models, prompts, and code objects.

A pipeline platform can execute on a server. A user can access the platform with a user device, either through an application that executes on the user device or through a web application. The platform can present a user interface (UI) with pipeline objects and tools for constructing an AI pipeline, which can display as a flow diagram on the UI. This can include receiving a selection of pipeline objects on the UI, the selected pipeline objects including a dataset object (for simplicity, called a "dataset") and an AI model. The AI model can be a language model, such as a small language model or large language model (LLM). LLMs are often discussed for convenience but any language model can apply to the examples below.

The system can receive further inputs to the UI to arrange the selected pipeline objects in an AI pipeline. For example, the pipeline objects can be dragged into position and connected to one another. The connection causes an execution linking between the selected dataset object and AI model to be established. The UI visually represents the established execution linking between the pipeline objects. The system can generate a pipeline manifest file that stores the arrangement of pipeline objects in the AI pipeline. When the manifest is validated, the AI pipeline is displayed as an execution flow within the UI. Validating the manifest can include checking the pipeline objects against dependency rules. Dependency rules dictate events that must occur before at least one of the selected pipeline objects can execute. The UI can display a validation of the pipeline manifest.

The system can also cause a management policy to be applied to the dataset object. The management policy can ensure that a user meets compliance requirements as a prerequisite for accessing the dataset object through execution of the AI pipeline. For example, if the user device does not have compliant settings, applications, or a geofenced location, the dataset can be inaccessible as part of the pipeline execution. This can be a useful wat to protect datasets that include sensitive or enterprise information. The management policy can be selected from multiple pre-defined policies, with a conditional code block dictating what to do when various compliance levels are achieved. In one example, the management policy requires that an end user attempting to access the AI application is authorized to access the dataset object based at least in part on the end user being associated with an identifier of an authorized group and a client device of the end user being compliant with at least one pipeline end user policy. The client device of the end user can be a computing device through which the access to the AI application is attempted. The UI can visually represent the application of the management policy to the dataset object.

The designed AI pipeline can then be tested within the UI in a simulated execution. The user can select a testing option on the UI. The user can input a test query or select a series of test queries for use in the simulated execution. Either way, the system can receive a test query in the UI. The system then causes the selected pipeline objects to be executed in an order that follows the execution linking displayed within the UI. The test query can be an input at one or more of the pipeline objects, just depending on the pipeline design. The system can then cause an output of the simulated execution to be displayed in the UI based on the test query.

When the user selects a deployment option, the system can cause the AI pipeline to be deployed. This can include indicating that a version identifier of the tested pipeline is now the active version. The deployed AI pipeline is accessible by at least one AI application through a generated endpoint. The endpoint, including an access key, can be distributed to applications on user devices, allowing the application to interact with the deployed AI pipeline. When the endpoint is accessed with the key, then a pipeline engine can execute the active version of the pipeline.

The pipeline builder UI can also implement administrative user policies in determining which pipeline objects are available to the user. For example, prior to displaying the selected pipeline objects, the system can determine that a computing device through which the UI is displayed is compliant with at least one pipeline administrative user policy. Compliance with the pipeline administrative user policy can be determined at least in part on information received from an AI management agent that executes on the computing device.

In one example, prior to displaying the pipeline objects that get selected in the UI, the method further comprises authenticating the administrator based on a user identifier and a tenant identifier. This can allow for differentiating available pipeline objects between users and tenants, tenants including different customers of an enterprise. The selected pipeline objects are selected from a displayed menu that includes AI model prompts, datasets, AI models, and executable code objects. One of the executable code objects is a conditional object that allows user selection of an if-then statement for at least two branches within the AI pipeline.

The examples summarized above can each be incorporated into a non-transitory, computer-readable medium having instructions that, when executed by a processor associated with a computing device, cause the processor to perform the stages described. Additionally, the example methods summarized above can each be implemented in a system including, for example, a memory storage and a computing device having a processor that executes instructions to carry out the stages described.

Both the foregoing general description and the following detailed description are exemplary and explanatory only and are not restrictive of the examples, as claimed.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

Figure 1:
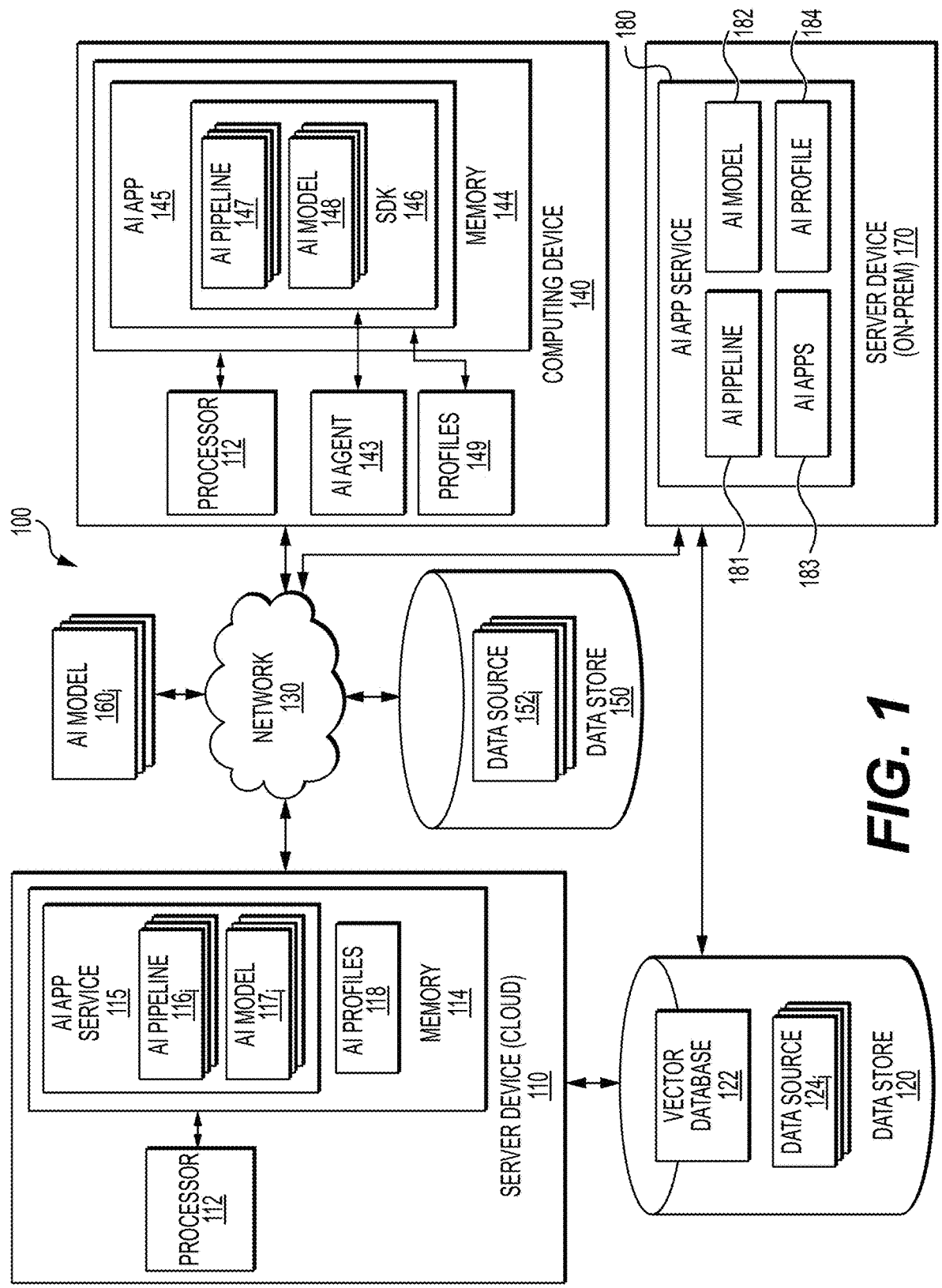
FIG. 1 illustrates a block diagram of a computer-based system configured to implement one or more aspects of the various embodiments.

FIG. 1 illustrates a block diagram of a computer-based system 100 configured to implement one or more aspects of at least one embodiment. As shown, the system 100 includes a server device 110 in communication with a data store 120, another data store 150, artificial intelligence (AI) models 160 (referred to herein collectively as AI models 160 and individually as an AI model 160), and a computing device 140. Illustratively, the server device 110, the AI models 160, the data store, and the computing device 140 are in communication over a network 130, which can be a wide area network (WAN) such as the Internet, a local area network (LAN), a cellular network, and/or any other suitable network.

As shown, an artificial intelligence (AI) application ("app") service 115 (also called "AI platform") executes on one or more processors 112 of the server device 110 and is stored in a system memory 114 of the server device 110. The AI app service 115 can act as an AI platform that provides customers with a way to easily create, deploy, and manage AI pipelines 116. Customers can create AI pipelines 116 that uniquely suit their needs. The AI app service 115 can present a graphical user interface (UI) that allows the user to design and manage the AI pipelines 116. The AI pipelines 116 can utilize AI models 117 to perform tasks for a wide range of enterprise and personal AI applications. An enterprise AI application can be used in a work setting, with managed access to various functions and datasets that are part of the application. A personal AI application can be one that a user downloads for personal use. The AI app service 115, can execute on a cloud server 110, or on one or more servers 170 that are located on premises at an enterprise.

AI profiles 118 can be stored at the AI platform for use in managing functionality of AI pipelines 116. The AI profiles 118 can be user specific, such that a user is assigned an AI profile 118 with information that impacts functionality with respect to that user. For example, the AI profile 118 can indicate a usage tier or enterprise group that applies to the user. The AI profile 118 can also track the user's activities at the AI app service 115. The AI app service 115 can use this information to determine which AI pipelines 116, datasets, AI models 117, prompts, and tools are available to the user.

An AI app service 180 that executes at an on-premises ("on-prem") server 170 can provide a customer with similar AI pipeline design and administration. But being on-prem can allow for some AI pipelines 181 and/or objects within those pipelines to securely execute within an enterprise's own trusted infrastructure, in an example. The AI app service 180 can include AI pipelines 181, AI models 182, AI profiles 184, and AI apps 183. The AI apps 183 can be managed enterprise applications in an example. These can be accessed through a secure dashboard by users who are enrolled and in compliance with the AI app service 180. For example, a content application can allow enterprise users access to enterprise documents. But the documents can be intelligently surfaced or expanded through use of AI pipelines 181 that operate with the content application according to a user's AI profile 184. The AI models 182 can run locally or in a trusted outside environment so as to not compromise sensitive enterprise data.

Users can access the AI app service 115, 180 though use of a computing device 140, which can be any processor enabled device. Examples include a laptop, phone, tablet, headset, and personal computer. An AI agent 143 can execute on the computing device 140. The AI agent 143 can allow the AI platform (e.g., app service 115, 170) to manage what functionality of the AI pipelines 116, 181 is available to the computing device 140. In one example, the AI agent 143 is installed on the computing device 140 as part of device enrollment at the AI platform, or as part of installation of an AI app 145 that interacts with the AI platform (e.g., AI app service 115, 180). The AI agent 143 can be part of an AI app 145 or operating system. Alternatively, the AI agent 143 or can execute as a stand alone application.

The AI agent 143 can ensure that the computing device 140 complies with management policies, and vary access to objects at the AI platform based on the level of compliance. For example, a compliant computing device 140 can download or access an AI app 183 and/or objects of an AI pipeline 181. But the AI platform can prevent a non-compliant computing device from executing the AI pipeline 181 or specific objects within the pipeline, such as specific AI models 182, tools, datasets, or prompt packages. Alternate AI pipelines 116, 147, 181 can be provided based on the level of compliance of the computing device 140.

One or more user or device profiles 118, 184 can be maintained at the platform and fully or partially maintained at the computing device 140 as profiles 149. Any or all of these profiles 118, 149, 184 can track user and device information that are utilized by the AI platform. The profile information can be updated by the AI platform, such as by storing query and result history, and learned aspects about the user that are relevant to an AI app 145 that utilizes the AI platform. The profile 118, 149, 184 itself can be an input to an AI pipeline 116, 147, 181.

A compliance management service can execute at the platform and can communicate with the AI agent 143 to ensure that a computing device 140 remains compliant with compliance rules as a requisite to AI pipeline operation.

Compliance rules can encompass configurable criteria that must be met for a client device to be considered "in compliance" with the AI pipeline management service. These rules can be determined based on various factors such as the geographical location of the client device, its activation and management enrollment status, authentication data (including data obtained by a device management system), time, date, and network properties, among others. User profiles associated with specific users can also influence the compliance rules. User profiles are identified through authentication data linked to the client device and can be associated with compliance rules that take into account time, date, geographical location, and network properties detected by the device. Furthermore, user profiles 149 can be connected to user groups (also called "management groups"), and compliance rules can be established based on these group associations.

Compliance rules set predefined constraints that must be satisfied for the AI pipeline management service or other applications to allow access to enterprise data or other features of the client device. In certain cases, the AI pipeline management service interacts with a management application, migration application, or other client application running on the device to identify states that violate one or more compliance rules. These non-compliant states can include the detection of viruses or malware on the computing device 140, the installation or execution of blacklisted client applications, or the device 140 being "rooted" or "jailbroken," which grants root access to the user. Other problematic states can involve the presence of specific files, suspicious device configurations, vulnerable versions of client applications, or other security risks. Sometimes, the migration service provides the compliance rules, which are based on the rules of the previous management service. Alternatively, the compliance rules can be directly configured in the AI pipeline management service by an administrator.

Returning to the functionality of the server device 110, 170, one or more processors 112 receive user input from input devices, such as a keyboard or a mouse. In operation, the one or more processors 112 may include one or more primary processors of the server device 110, controlling and coordinating operations of other system components. In particular, the processor(s) 112 can issue commands that control the operation of one or more graphics processing units (GPUs) (not shown) and/or other parallel processing circuitry (e.g., parallel processing units, deep learning accelerators, etc.) that incorporates circuitry optimized for graphics and video processing, including, for example, video output circuitry. The GPU(s) can deliver pixels to a display device that can be any conventional cathode ray tube, liquid crystal display, light-emitting diode display, and/or the like.

The system memory 114 of the server device 110 stores content, such as software applications and data, for use by the processor(s) 112 and the GPU(s) and/or other processing units. The system memory 114 can be any type of memory capable of storing data and software applications, such as a random-access memory (RAM), a read-only memory (ROM), an erasable programmable read-only memory (EPROM or flash ROM), or any suitable combination of the foregoing. In some embodiments, a storage (not shown) can supplement or replace the system memory 114. The storage can include any number and type of external memories that are accessible to the processor 112 and/or the GPU. For example, and without limitation, the storage can include a secure digital card, an external flash memory, a portable compact disc read-only memory (CD-ROM), an optical storage device, a magnetic storage device, and/or any suitable combination of the foregoing.

The server device 110 shown herein is for illustrative purposes only, and variations and modifications are possible without departing from the scope of the present disclosure. For example, the number of processors 112, the number of GPUs and/or other processing unit types, the number of system memories 114, and/or the number of applications included in the system memory 114 can be modified as desired. Further, the connection topology between the various units in FIG. 1 can be modified as desired. In some embodiments, any combination of the processor(s) 112, the system memory 114, and/or GPU(s) can be included in and/or replaced with any type of virtual computing system, distributed computing system, and/or cloud computing environment, such as a public, private, or a hybrid cloud system.

In some embodiments, the AI platform application 115 is configured to facilitate the design, instantiation, modification, testing, and/or execution of AI pipelines 116*i* (referred to herein collectively as AI pipelines 116 and individually as an AI pipeline 116) that use one or more AI models 117 (referred to herein collectively as AI models and individually as an AI model 117), as discussed in greater detail below in conjunction with FIGS. 2-4. Generated AI pipelines, such as AI pipelines 147*i* (referred to herein collectively as AI pipelines 117 and individually as an AI pipeline 147), and AI models, such as AI models 148 (referred to herein collectively as AI models 148 and individually as an AI model 148), can also or instead be deployed to execute elsewhere, such as in a client application 145, which as shown includes a software development kit (SDK) that includes the API pipelines 147 and the AI models 148. Illustratively, the client application 145 is stored in a system memory 144, and executes on a processor 142, of the computing device 140, which can be similar to the processor 112 and the memory 114 of the server device 110, respectively. A machine learning (ML) model is one type of AI model.

In one example, a local AI pipeline 147 and AI Model 148 can be used as part of a larger AI pipeline 181 of the AI platform. This can allow for preprocessing locally, such as the redaction of personally identifiable information (PII). The local AI pipeline 147 and AI Model 148 can recognize PII in content before the content is sent to a cloud server 110, in an example. A discriminative model can run locally on the computing device 140, not relying on generative AI, such as LLMs, whether run locally or in the cloud. The recognized PII can be replaced with encrypted information, and a decryption mechanism, such as a key, hash, password or other information, can be supplied by the AI agent 143 to the AI platform. The decryption mechanism can be stored separately from the content with the removed PII, in an example. The decryption mechanism can allow the user or other authorized users to decrypt and reinsert the PII at a later time.

Each of the data store 120 and the external data store 150 can include any storage device or devices, such as fixed disc drive(s), flash drive(s), optical storage, network attached storage (NAS), and/or a storage area-network (SAN). Although shown as distinct from the server device 110, in at least one embodiment the server device 110 can include the data store 120 and/or the data store 150. Illustratively, the data stores 120 and 150 store data sources 124*i* (referred to herein collectively as data sources 124 and individually as a data source 124) and 152*i* (referred to herein collectively as data sources 152 and individually as a data source), respectively. In addition, the data store 120 stores a vector database 122. In operation, execution of the AI pipelines 116 and/or 147 can include use of local AI models (e.g., AI models 117 or 148) and/or remote AI models (e.g., AI models 160) that process input data along with data from one or more data sources 124 and/or 152 that are identified via an embedding search using the vector database 122 and provided to the local and/or remote AI models as context, as discussed in greater detail below in conjunction with FIGS. 2-5 and 11.

Although a server device 110 and a computing device 140 are shown for illustrative purposes, in some embodiments, each of the AI platform application 115 and/or client applications can be implemented in any combination of software and/or hardware and can execute in any technically feasible type of computing system, such as a desktop computer, a laptop computer, a mobile device, a virtualized instance of a computing device, a datacenter computing system, a distributed and/or cloud-based computing system, and so forth.

Figure 2:
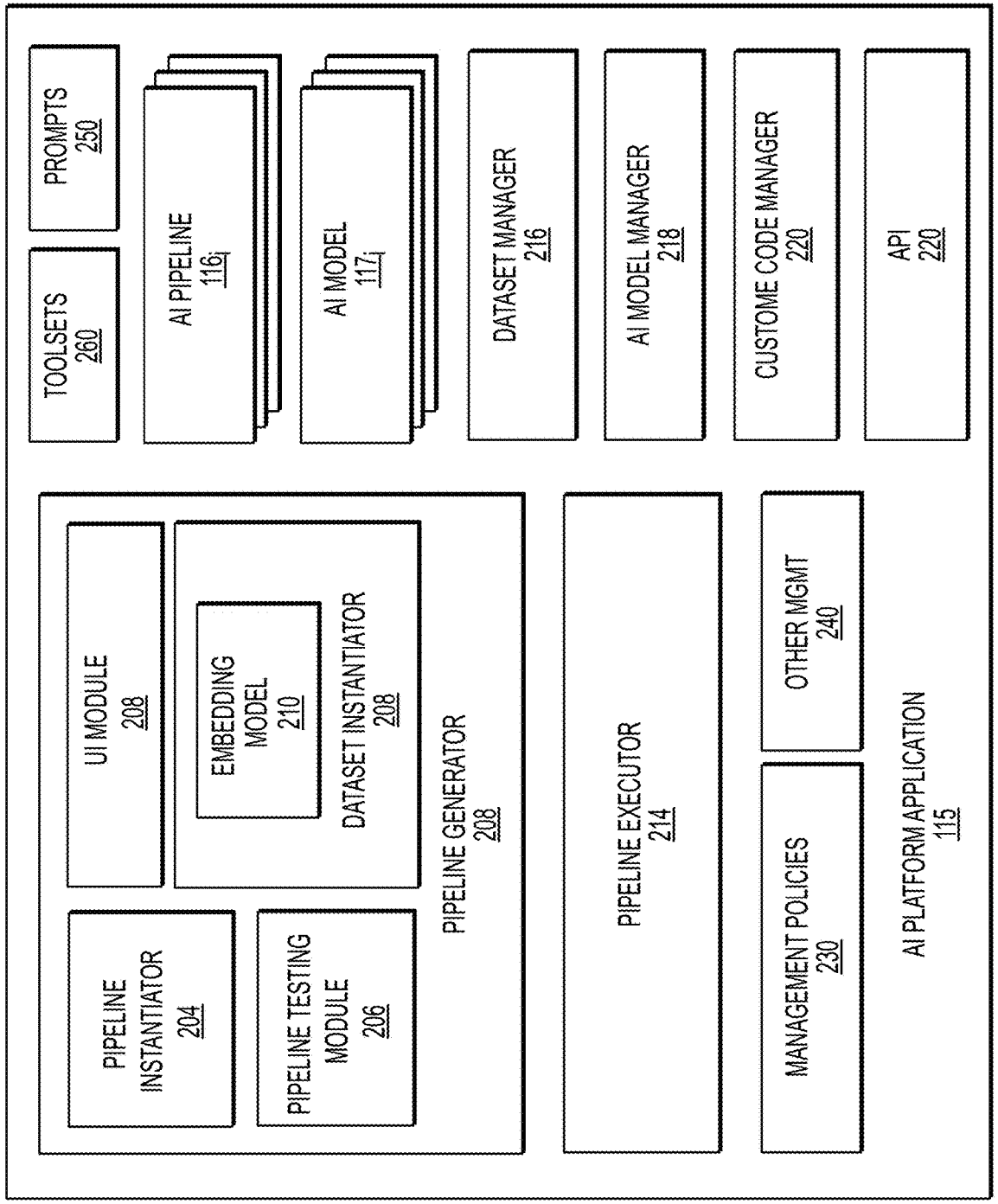
FIG. 2 is a more detailed illustration of the artificial intelligence (AI) platform application of FIG. 1, according to various embodiments.

FIG. 2 is a more detailed illustration of the AI platform application 115 of FIG. 1, according to various embodiments. As shown, the AI platform application 115 includes a pipeline generator module 202, a pipeline executor module 214, the AI pipelines 116, the AI models 117, a dataset manager 216, an AI model manager 218, a custom code manager 220, and an application programming interface (API) 222.

The pipeline generator 202 includes a pipeline instantiator module 204, a pipeline testing module 206, a user interface (UI) module 208, and a dataset instantiator module 212. In operation, the UI module 208 generates one or more UIs that permit a user, such as an information technology (IT) administrator, to define AI pipelines that each include one or more objects having associated parameters, as well as relationships between the object(s). In some embodiments, each AI pipeline can include a directed graph that includes multiple objects and indicates how the outputs of one or more objects are input into, or otherwise depend on, other object(s). Given user input defining objects (including parameters thereof) and/or pipelines of objects, the pipeline instantiator 204 instantiates the objects and/or pipelines, such as by adding the objects and/or pipelines to a database and/or generating program code for the objects and/or pipelines, as discussed in greater detail below in conjunction with FIGS. 8-10. In some embodiments, one particular type of object is a dataset object that defines a dataset from which chunks of text that are relevant to input can be retrieved for inclusion, along with the input, in the context window of a prompt that is input into an AI model. In such cases, to instantiate a dataset object, the dataset instantiator 212 (1) divides text data from a data source associated with the dataset object into chunks that can be referenced for later use, and (2) processes the chunks using a trained embedding model that generates embeddings of the chunks in a high-dimensional latent space.

Then, the dataset instantiator stores the embeddings of the chunks in the vector database 122 for use in embedding searches, as discussed in greater detail below in conjunction with FIGS. 3 and 9. The pipeline testing module 206 permits users to test instantiated pipelines against various input data to see what outputs are generated by those pipelines, as discussed in greater detail below in conjunction with FIG. 7. The pipeline executor 214 executes pipelines that have been instantiated and tested. For example, the client application 145 could make a call via the API 222 to execute a pipeline, or the AI platform application 115 itself could execute a pipeline.

The platform can also store prompt packages 250 for use in the AI pipelines. An administrator user (of the platform or customer of the platform) can create enterprise prompts that end users do not see. The enterprise prompts can be fed into an LLM in a pipeline to guide the LLM towards results that are usable by the AI apps. This can include ensuring that the results include particular content and exclude other content, and that the results are formatted for use with the AI application. The platform can also track user prompts, which can be prompts created by an end user.

The platform also stores toolsets 260 (also called "tools") for inclusion in the AI pipelines. Toolsets 260 can include scripts and code for various processing, including pre- and post-processing.

Tools 260 can be ingested through an API to the AI platform. The API Ingestion process can utilize an API definition file in an example. Alternatively, tools can be ingested based on tool documentation or a website. For example, an ingestion pipeline can ingest the text, identify APIs, determine semantic meaning of the API description, and create a Tool Action in the pipeline builder. The ingestion pipeline can also add API calls, add authentication keys, and make the tool available as a dropdown in the UI under the Tool object. In this way, a Third Party Service can be made accessible via the APIs.

Additional compliance rules can include data privacy and security rules. These can ensure that sensitive company data is not shared with AI applications without proper authorization. Data encryption can be enforced on secure communication channels when interacting with AI systems. User access to AI applications 145, 183 can be restricted based on user groups, roles, and permissions.

Prompt policies can prohibit the use of AI applications to generate content that infringes on copyrights, trademarks, or patents. The AI platform can implement content filtering and monitoring mechanisms to detect and prevent the generation of protected intellectual property. The prompt policies can prohibit the generation of harmful, discriminatory, or biased content. The AI platform can enforce management policies against using AI for malicious purposes, such as creating fake news, deepfakes, or engaging in social engineering attacks.

As additional security measures, the AI platform can maintain a centralized repository of approved AI models and datasets for employee use. The AI platform can implement version control and model lineage tracking to ensure the integrity and reproducibility of AI-generated outputs. The platform can also regularly audit and validate AI models for accuracy, fairness, and absence of bias.

Access controls and authentication can be added to the AI platform. The system can implement strong authentication mechanisms, such as multi-factor authentication, for accessing AI applications. The system can also enforce least privilege principles, granting employees access only to the AI features and data necessary for their job functions.

The AI platform can also run logging and monitoring services. This can enable comprehensive logging of AI application usage, including user activities, input prompts, and generated outputs. The AI platform can also perform real-time monitoring and run alerting systems to detect anomalous or suspicious AI usage patterns. An administrative pipeline can regularly review logs and audit trails to ensure compliance with established policies.

As part of third-party AI application management, a vetting process can be executed on third-party AI applications before allowing their use within the organization. In general, this can include assessing the security, privacy, and compliance posture of external AI providers to ensure they align with the organization's standards.

Figure 3:
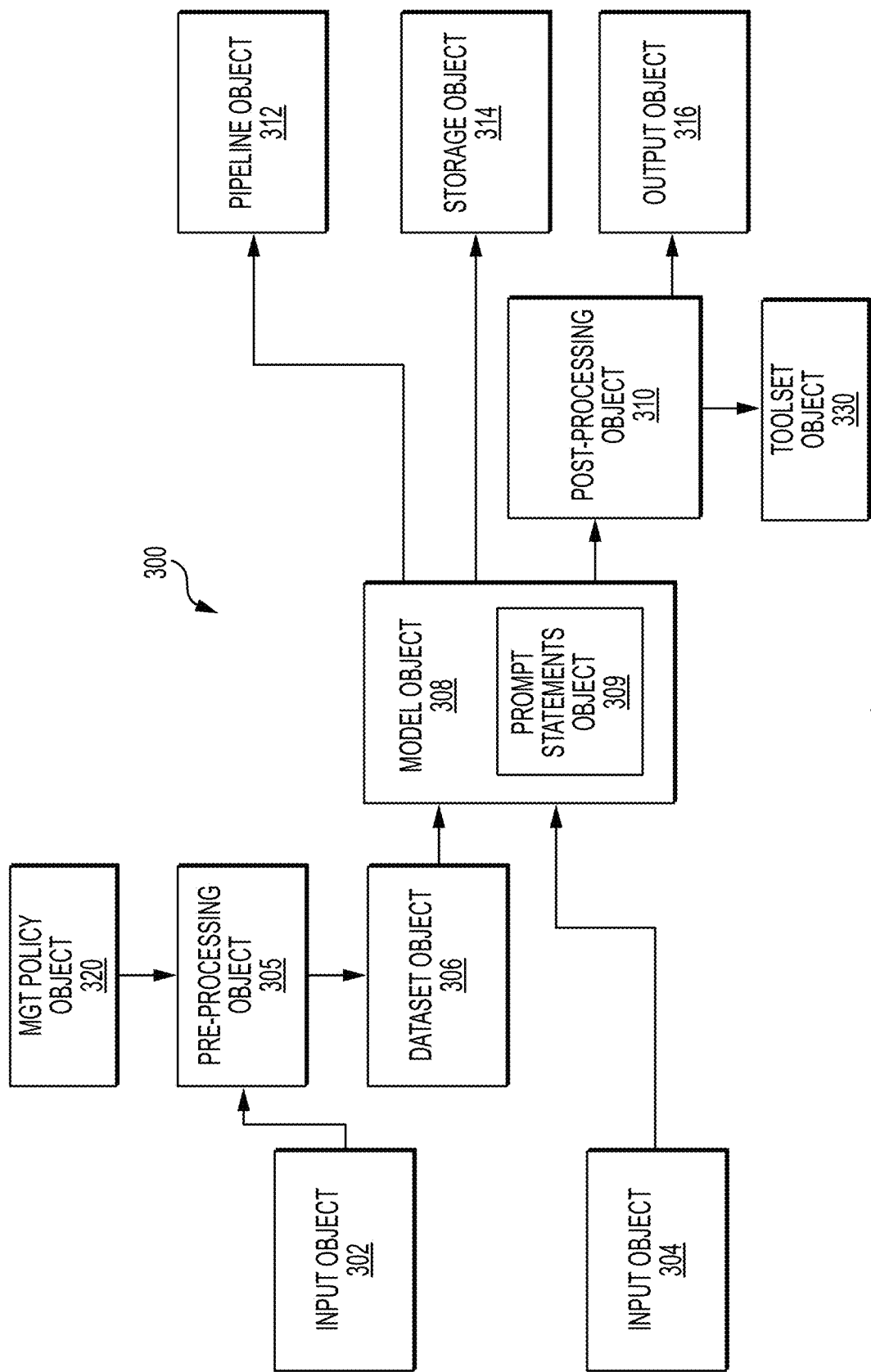
FIG. 3 illustrates an exemplar AI pipeline, according to various embodiments.

FIG. 3 illustrates an exemplary AI pipeline 300, according to various embodiments. The AI pipeline 300 can display on a UI of an administrator console, and each pipeline object can be placed in the UI to create the AI pipeline 300. As shown, the AI pipeline 300 includes two input objects 302 and 304, a preprocessing object 305, a dataset object 306, a model object 308, a prompt statements object 309, a post-processing object 310, a pipeline object 312, a storage object 314, an output object 316, a management policy object 320, and a toolset object 330. Further, the AI pipeline 300 indicates the relationships between objects 302, 304, 306, 308, 309, 310, 312, 314, and 316.

The system can cause display of the UI by sending code from a server to a user device, which renders in a browser. In another example, the server sends code to a different client application, causing the UI to display in the client application.

The input objects 302 and 304 define inputs into the AI pipeline 300. In some embodiments, each of the input objects 302 and 304 can define a user input or stored data to be retrieved as input. For example, the user input could be a question entered by a user into a UI provided by the AI platform application 115 or the AI application 145. As another example, the stored data could include a profile, or a summarization of previous conversations with an AI model by the same user that is retrieved from a database. Both input objects 302, 304 can be defined to receive a particular type of content or information from the AI application 145.

A preprocessing object 305 can include code that examines or modifies the content of input object 302 as a prerequisite to further stages in the AI pipeline. For example, the preprocessing object 305 can check for malicious code, such as embedded prompts, queries that attempt to reveal system prompts, and other attempts to harm the system or circumvent controls. The pre-processing can also format the input for use within further stages of the pipeline. For example, images in an email signature line can be stripped out before the email content is passed to an embedding model for vectorization.

As another example, the preprocessing object 305 can be used for redacting PII before it is sent to a generative model, such as an LLM. The recognized PII can be replaced with encrypted information, and a decryption mechanism, such as a key, hash, password or other information, can be supplied by the AI agent 143 to the AI platform. The decryption mechanism can be stored separately from the content with the removed PII, in an example. The decryption mechanism can allow the user or other authorized users to decrypt and reinsert the PII at a later time.

In another example, a management policy object 320 can be used to apply management policies to the pre-processing object 305 or other objects in the AI pipeline 300. The management policy can allow an administrator to define conditions that are user specific and based on compliance. For example, a user or application might only be able to access a dataset from within an AI application on a compliant device, when the user is located within a whitelisted geography or outside of a blacklisted geography.

The management policies can be stored on a server and can relate to a user, device, model object, prompt object, dataset object, toolset object, and endpoint. For example, user policies can be specific to a user or a group of users. Device policies can apply to specific devices or device types. Model policies can govern use of particular AI models. Prompt policies can govern which prompts must be included and which ones are disallowed. Dataset policies can control which datasets or portions of those datasets are available for use in the pipeline. Toolset policies can govern what code and software is executable as part of a pipeline. And endpoint policies can generally govern access and execution of the pipeline itself.

Management policies related to the pipeline itself can limit model types that are available for use. For example, a pipeline policy can disallow public model inference endpoints such as OPENAI or ANTHROPIC. A pipeline policy can require only platform-hosted models, only on-prem hosted models, or only specific model files that have been validated for security. The policy can be applied to the entire pipeline or just specific console users, specific dataset objects, and the like. In one example, a model policy can be applied that allows only models below a configured cost per token to be used in the pipeline. Cost per token for different models can be configured in a fixed configuration or pulled dynamically from the model provider(s).

In the pipeline 300, the preprocessing object 305 can include a management policy check based on management policy object 320. If the user and device comply with the management policy check, then the dataset object can be accessed. If not, then information from the dataset object 306 is not fed to the model object 308.

Another management scenario arises when a UI administrative user has access to a dataset for purposes of adding the dataset to a pipeline but does not have access to some or all of the content of the dataset. In this case, permissions can be validated at pipeline runtime to ensure that whatever content from the dataset is needed by the model(s) is in fact accessible to the end user executing the pipeline.

The dataset object 306 defines a dataset from which chunks of text that are relevant to input from the input output 302 can be retrieved for inclusion, along with outputs of the input object 302 and the input object 304, in the context window of a prompt that is input into an AI model defined by the model object 308. In some embodiments, the dataset is generated by (1) dividing text data (e.g., text from documents) in a data source into chunks of a predefined length (e.g., a predefined number of tokens), and (2) processing the chunks using a trained embedding model that generates embeddings of the chunks in a high-dimensional latent space. For example, in some embodiments, each of the embeddings can be a vector of numbers that represents the semantic meaning of a corresponding chunk of text data. Once generated, the embeddings can be stored in, e.g., the vector database 122 and used to perform embedding searches that identify chunks of text data that are relevant to one or more inputs. The chunks of text can then be included in the context window of a prompt to an AI model with an instruction for the AI model to, for example, only answer based on the relevant chunks. As another example, the relevant chunks can be included as few-shot examples in a prompt. In some embodiments, the dataset object 306 can specify (1) one or more data sources, (2) a chunk size, (3) one or more embedding models used to generate embeddings from chunks, (4) a similarity metric used in embedding searches to compare embeddings of inputs with the embeddings generated from chunks, and (5) a similarity threshold for selecting a number of chunks and/or a maximum a number of chunks to include in the context window of a prompt. In some embodiments, the dataset object 306 can also specify a schedule for generating embeddings of chunks of source data so that the embeddings are updated if the source data changes. Although described herein primarily with respect to generating embedding using a single selected embedding model, in some embodiments, any number of embeddings can be generated for each dataset using any number of embedding models specified in a dataset object.

In one example, the chunks are not a predefined length. For example, the chunks can be sentence-based. In that approach, chunking uses a sentence-segmentation technique, such that individual sentences are treated as chunks, regardless of their length or punctuation. Chunks with this technique can be of variable length.

Chunking can also be done using semantic understanding. In this technique, text can be sent to a LLM, with prompt instructions to split it into individual chunks that best capture meaning. Based on how the prompt instruction are given, chunks with this technique can be fixed or variable length.

The model object 308 defines an AI model (e.g., one of the models 117, 148, or 160) to use. Any technically feasible AI model can be specified by the AI model 308 in some embodiments. For example, an artificial neural network, such as a language model (e.g., a large or small language model), a generative pre-trained transformer (GPT) model, a multi-modal model, a visual language model, and/or the like can be specified in some embodiments. The AI model can also be trained from scratch or a fine-tuned version of a previously trained model. Further, the specified AI model can execute locally on the same computing device or remotely, such as in a datacenter or cloud computing environment. In addition, in some embodiments, the model object 308 can abstract away the conversion and/or normalization of data into a format that is suitable for input into the AI model, so that a user does not need to The prompt statements object 309 defines zero or more statements to include in the context window of prompts that are input into the AI model of the model object 308. Any suitable user-specified or predefined statement(s) can be included in some embodiments. For example, the following statement could be used to instruct the AI model to generate an answer only using information from the chunks of data generated by execution of the dataset object 306, and to cite a reference and document name used to generate the answer: "You are a helpful assistant. Above is some helpful context. Answer the question, and only use the information above. Cite the exact reference and document name you used to answer." Such a statement could be entered by a user or selected by the user from a predefined list of statements. As another example, the following statement could be used to instruct the AI model to not mention product X when answering a question: "When answering the question, do not mention product X in your answer." As a further example, one or more statements can be used to specify one or more tools, such as publicly available tools (e.g., tools for checking the weather, retrieving or sending data, etc.) that are accessible via application programming interfaces (APIs), that the AI model can use and how to access such tools. As yet another example, a statement can instruct the AI model to respond that it cannot answer a question if no chunks of relevant text included in a prompt to the AI model.

The post-processing object 310 defines post processing to be performed on an output of the AI model defined in the model object 308. Any technically feasible post processing can be performed in some embodiments. For example, the post-processing could include redacting an answer generated by the AI model using another AI model or custom program code to remove sensitive and/or undesirable information. As another example, the post-processing could include transforming the answer generated by the AI model from one format to another format.

Post-processing can also include moderation. For example, code can check that the answer is within acceptable formatting, limits, and subject matter relevance. The moderation can also check for issues, such as prompt leakage.

Post-processing can also unredact previously redacted portions of a dataset or other data if the user has the required privileges to do so. If redaction is carried out by the pre-processing step, the post-processing step can support unredaction of the content back to the original fields. In one example, if the redacted information belongs to the user, then the post-processing can unredact that information. Similarly, a user having access to redacted information can cause the post-processing object 310 to unredact the information. In an example where the user has the requisite access criteria, a stored mechanism for unredaction, such as a key, can be retrieved based on a content identifier or chunk metadata associated with the content. The unredaction mechanism can then be applied against redacted information to decrypt it.

The pipeline object 312 defines another pipeline that takes as input an output of the AI model defined by the model object 308. Any suitable other pipeline can be specified by the pipeline object 312. For example, the other pipeline can include (1) an input object that specifies the pipeline object 316 as an input source; and (2) one or more other objects, such as dataset object(s), model object(s), etc., that define how the output of the AI model defined by the model object 308 is processed.

The storage object 314 defines a manner of storing output generated by the AI model of the model object 308. In some embodiments, the storage object 314 can specify any technically feasible storage mechanism. For example, in some embodiments, one type of storage object can define that output of the AI model and other conversation history is stored in memory. As another example, in some embodiments, one type of storage object can define that output of the AI model and other conversation history is summarized in a particular format (e.g., JavaScript Object Notation (JSON) format) by the same or a different AI model, and the summary is stored in a database. In such cases, an input object (input object 302 or 304) of the AI pipeline 300 or another AI pipeline can also define that the output of the AI model and the conversation history that is stored in memory or summarized and stored in the database is retrieved for inclusion in the context window of a prompt.

The output object 316 defines how to output the post-processed output generated by executing the post-processing object 310. Any suitable output can be specified by the output object 316 in some embodiments. For example, the output object 316 could specify that the post-processed output is displayed to a user. As another example, the output object 316 could specify that the post-processed output is transmitted to another application for further processing.

Although the AI pipeline 300 that includes the objects 302, 304, 306, 308, 310, 312, 314, and 316 is shown for illustrative purposes, in some embodiments, a user can define any suitable AI pipeline that includes one or more input objects, one or more model objects, and zero or more other objects, as well as any suitable relationships between the objects. More generally, in some embodiments, the AI platform application 115 can permit a user to define any suitable objects by specifying parameters thereof, and then add one or more of the objects to AI pipelines that relate the added objects. Examples of other types of objects include a pre-processing object that defines pre-processing to perform on inputs and/or retrieved chunks of text data from a dataset, a custom code object that defines custom program code to execute, a throttling object that throttles the use of a pipeline by a user so that users cannot abuse the pipeline, a data retention policy object that causes certain data generated by a pipeline to be stored for a certain period of time. For example, the custom program code could be used to perform pre-processing, to perform post-processing, to provide a tool that performs any suitable functionality, and/or the like. In some embodiments, the relationships between objects can also include relationships in which the output of one object is input back into a previous object.

In some embodiments, an AI pipeline can also define how timeouts and failure scenarios are handled, such as when an AI model does not respond. In some embodiments, an AI pipeline can also define a schedule (e.g., weekly, daily, etc.) for executing the AI pipeline, or that the AI pipeline is executed only via an API call. In some embodiments, an AI pipeline can also define trying one model (e.g., a low cost model) before another model (e.g., a high cost model).

The pipeline objects of FIG. 3 can also be set according to object parameters. The parameters available can vary depending on the administration mode. In one example, a simplified mode provides summaries of parameter object parameter packages that are selectable. An expert or developer mode, meant for developers, can allow an administrator to access a more full compliment of available object parameters. For example, in expert mode, the administrator can see and edit the configuration of different blocks and connections via a text-based interface.

Returning to FIG. 2, the dataset manager 216, the AI model manager 218, and the custom code manager 220 manage dataset objects generated by the dataset instantiator 212, model objects, and custom program code required to execute objects, respectively. For example, in some embodiments, the dataset manager 216 can manage the generation of datasets for dataset objects by the dataset instantiator and storage usage of generated datasets; the AI model manager 218 can manage the generation (e.g., training and/or fine tuning) of AI models for model objects and the execution thereof; and the custom code manager 220 can manage the generation, storage, and execution of custom program code for custom code objects.

Other managers 240 can also execute on the AI app service 115, 180. For example, a prompts manager can manage the generation or editing of prompt packages. A toolsets manager can manage the generation or editing of toolsets, such as scripts and code. An endpoint manager can manage the creation and storage of pipeline endpoints and keys.

A policy manager (also called the AI management service) can manage the generation or editing of management policies. As discussed at length above, computing device 140 access to an AI-enabled app, AI pipelines, and pipeline objects can be driven by management policies and compliance rules. These can depend on device states, device configurations, network configurations, datacenter management policies, pipeline object states, infrastructure states, management groups, and tenancy.

These various states and configurations can be combined to create management policies that are set by the AI management service. As a result of an administrator creating a configuration profile specifying particular settings/values that must be implemented, the AI management service can monitor the various states and configurations to ensure that the management policies are met. The monitoring can determine a user's authorization to execute or access AI-enabled applications, AI pipelines, and AI pipeline objects.

The AI management service can monitor pipeline object states. These monitored states can be data ingestion states, model development and training states, model evaluation and testing states, model deployment and serving states, model monitoring and maintenance states, infrastructure states, and pipeline and workflow states.

The pipeline executor 214 orchestrates the execution of AI pipelines. In some embodiments, the pipeline executor 214 can orchestrate the execution of each object of an AI pipeline according to the relationships between the objects. In such cases, execution of the AI pipeline can proceed from input object(s) to object(s) that take as input the output of the input object(s), and so forth, until all objects of the AI pipeline have been executed.

The API 222 exposes functions that can be called by other software, such as the client application 145, to interact with AI platform application 115. For example, in some embodiments, the functions can include functions for defining objects and AI pipelines, functions for testing AI pipelines, functions for executing AI pipelines subsequent to testing, and/or the like.

Compliance rules can encompass configurable criteria that must be met for a client device to be considered "in compliance" with the AI pipeline management service. These rules can be determined based on various factors such as the geographical location of the client device, its activation and management enrollment status, authentication data (including data obtained by a device management system), time, date, and network properties, among others. User profiles associated with specific users can also influence the compliance rules. User profiles are identified through authentication data linked to the client device and can be associated with compliance rules that take into account time, date, geographical location, and network properties detected by the device. Furthermore, user profiles can be connected to user groups, and compliance rules can be established based on these group associations.

Compliance rules set predefined constraints that must be satisfied for the AI pipeline management service or other applications to allow access to enterprise data or other features of the client device. In certain cases, the AI pipeline management service interacts with a management application, migration application, or other client application running on the device to identify states that violate one or more compliance rules. These non-compliant states can include the detection of viruses or malware on the device, the installation or execution of blacklisted client applications, or the device being "rooted" or "jailbroken," which grants root access to the user. Other problematic states can involve the presence of specific files, suspicious device configurations, vulnerable versions of client applications, or other security risks. Sometimes, the migration service provides the compliance rules, which are based on the rules of the previous management service. Alternatively, the compliance rules can be directly configured in the AI pipeline management service by an administrator.

Figure 4:
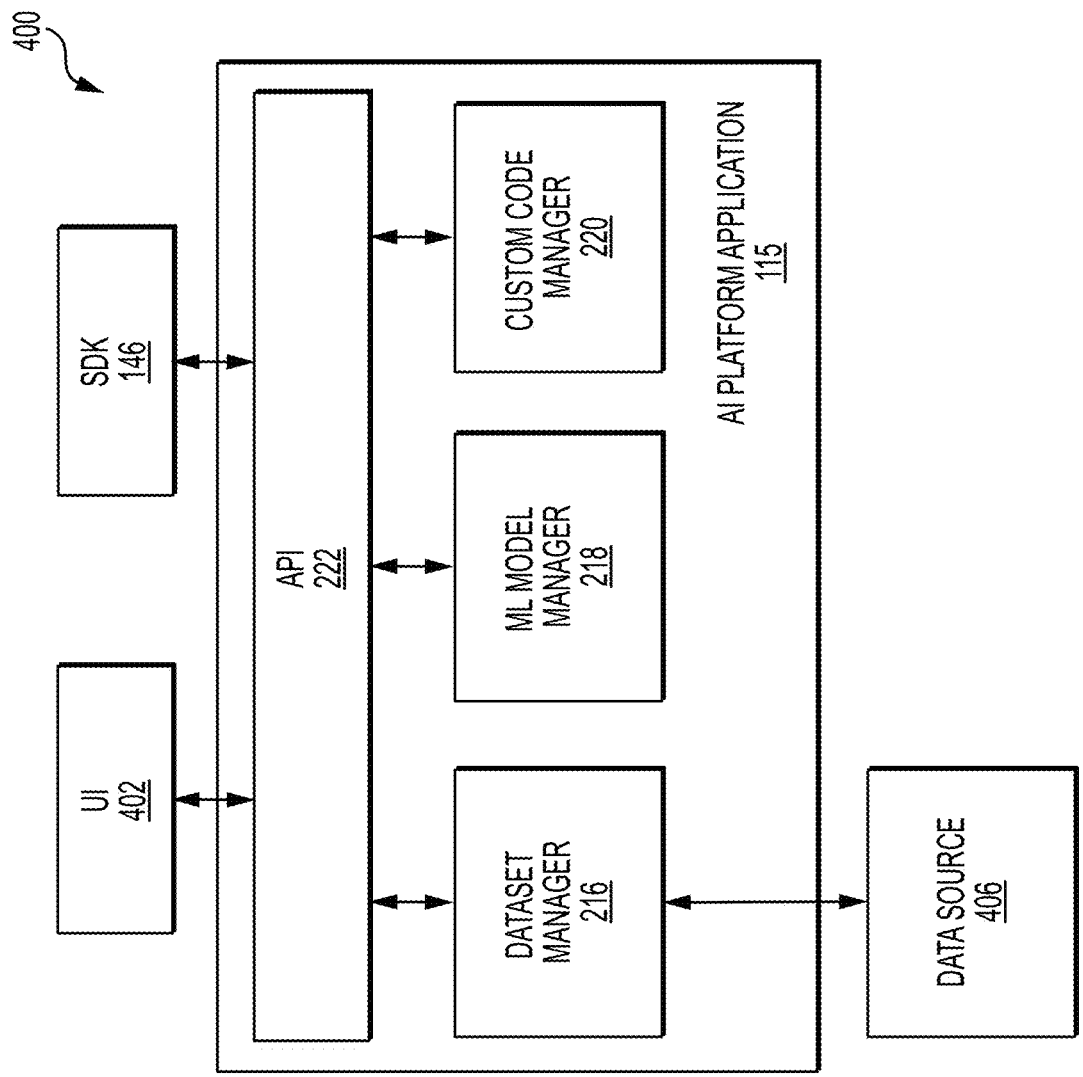
FIG. 4 illustrates exemplar interactions with the AI platform application of FIG. 1, according to various embodiments.

FIG. 4 illustrates exemplary interactions with the AI platform application 115 of FIG. 1, according to various embodiments. As shown, a UI 402 and the software development kit (SDK) 146 of the client application 145 communicate with the API 222 of the AI platform application 115. Further, the API 222 is in communication with the dataset manager 216, the AI model manager 218, and the custom code manager 220. In addition, the dataset manager 216 is in communication with a data source 406. In operation, a user, such as an IT administrator, can use the UI 402 to define a pipeline, including objects thereof and relationships between the objects. User interactions with the UI 402 are translated (by, e.g., a web application or software develop application) to API calls to the API 222, which in turn cause the dataset manager 216, the AI model manager 218, and the custom code manager 220 to, based on the API calls, manage the generation and storage of dataset objects from the data source 406 (and/or other data sources), model objects, and custom code objects, respectively, as described above in conjunction with FIG. 3.

The SDK 146 of the client application 145 permits the client application 145 to make API calls to the API 222 to access AI pipelines 116 maintained by the AI platform application 115. For example, in response to a user of the client application 145 entering a question into a text field within a UI provided by the client application 145, the client application 145 could use the SDK 146 to make an API call to the API 222 to execute one of the AI pipelines 116 for processing the question. In some embodiments, the SDK 146 can also include pipelines and/or AI models that permit local execution of the pipelines and/or AI models, without having to access the API 222.

The UI 402 can present different functions and options based on which mode the administrator selects. In a developer mode, a full complement of parameters can be available. Whereas in a normal mode, a more limited but understandable set of options can be presented that triggers preset packages of parameters for the pipeline objects.

Figure 5:
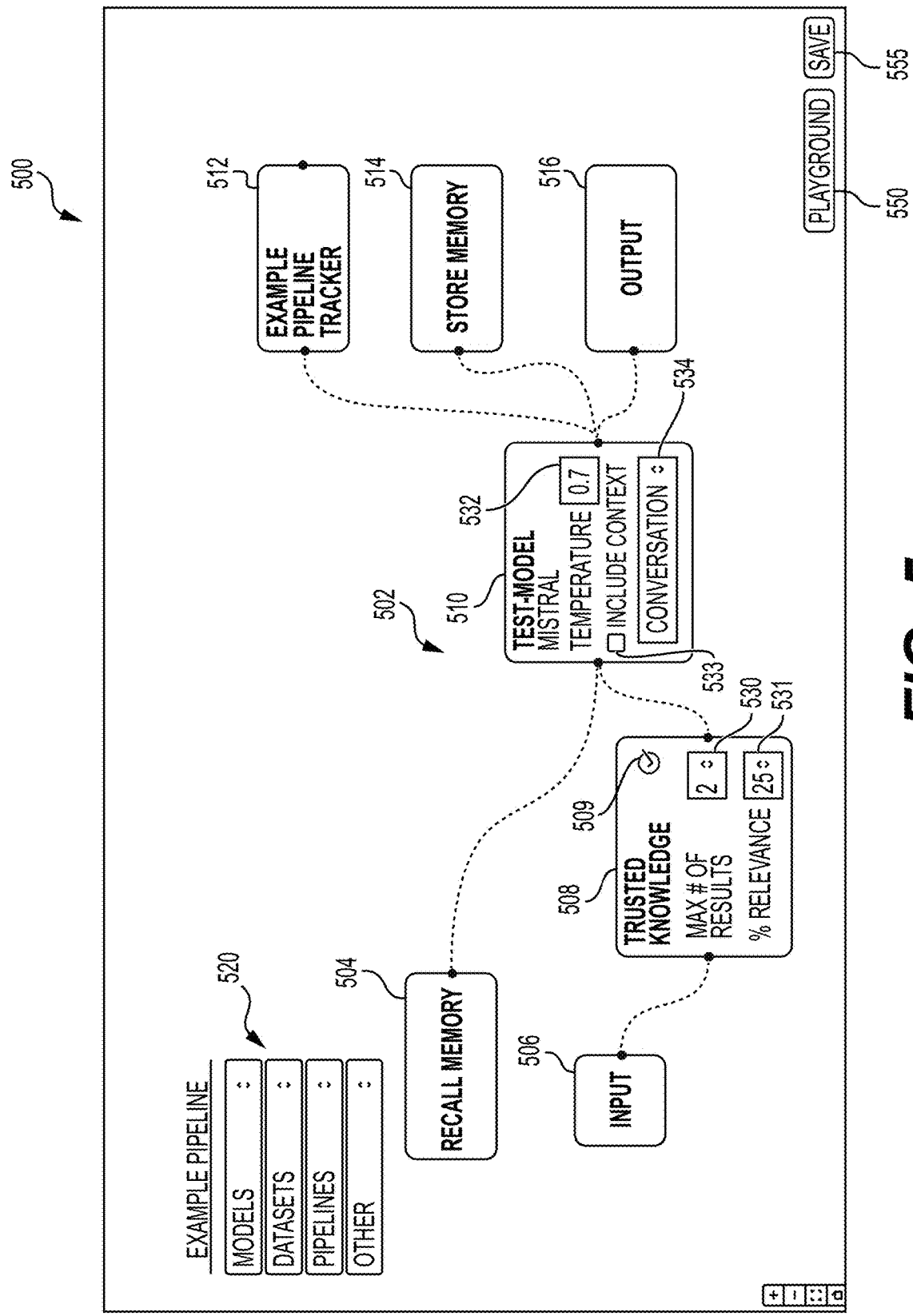
FIG. 5 illustrates how an AI pipeline can be designed using an exemplar UI, according to various embodiments.

FIG. 5 illustrates how an AI pipeline can be designed using an exemplar UI, according to various embodiments. As shown, a UI 500 displays a graphical representation of an AI pipeline 502 named "Example Pipeline." The graphical representation of the AI pipeline 502 includes boxes 504, 506, 508, 510, 512, 514, and 516 representing objects in the AI pipeline 502 and dashed lines between certain boxes representing relationships between the objects that are represented by the boxes. The UI 500 also includes a menu section 520 that provides menus for a user to select model objects, dataset objects, pipelines, and/or other objects for inclusion in the API pipeline 502. Using the menu section 520, a user can drag-and-drop objects from the menus and add relationships (shown as dashed lines) between such objects and one or more other objects to design an AI pipeline, such as the AI pipeline 502. The UI 500 also permits a user to move the boxes 504, 506, 508, 510, 512, 514, and 514 within the UI 500, as well as to change the relationships between objects.

Illustratively, the box 504 represents an input object named "Recall Memory" that retrieves a conversation history, and the conversation history is stored in memory by an output object named "Store Memory" that is represented by box 514. The box 506 represents another input object named "Input" that specifies a user input, such as a question entered into a text field within a UI provided by the client application 145.

The box 508 represents a dataset object named "Trusted Knowledge", and the box 508 includes input fields 531 and 530 that can be used to specify (1) a requirement percentage relevance when retrieving text chunks using an embedding search against the dataset, and (2) a maximum number of text chunks to output, respectively. In addition, the box 508 includes a status indicator 509 that can indicate whether the dataset is ready for use, is being instantiated, is being updated, etc. Illustratively, the status indicator 509 shows a green check mark, indicating the dataset is ready for use. Another status indicator, such as a red X, could be used to indicate that the dataset is not ready for use.

The box 510 represents a model object named "jjm-test-model." Illustratively, the box 510 includes an input field 532 that can be used to adjust a temperature parameter used by an AI model of the model object, a checkbox field 532 that can be selected to include data (e.g., a user role that affects how the AI model should response) from a predefined source in the context window of a prompt, and a drop-down selection field 534 that can be used to select a prompt statements object. As shown, a prompt statements object named "conversation" has been selected. Accordingly, statements defined by the "conversation" prompt statements object will be included in the context window of each prompt that is input into the AI model of the AI object represented by the box 510.

The box 512 represents a pipeline object named "Example Pipeline-Tracker." The pipeline object causes outputs generated by the AI model of the model object represented by the box 510 to be input into another AI pipeline named "Example Pipeline-Tracker."

The box 514 represents a storage object named "Store Memory" that causes outputs generated by the AI model of the model object represented by the box 510 to be stored, along with other conversation history from a current conversation, in memory (e.g., memory 114). As described, the input object named "Recall Memory" that is represented by the box 504 can retrieve the conversation history that is stored in memory for further processing via the AI pipeline 512.

The box 516 represents an output object named "Output" that causes outputs generated by the AI model of the model object represented by the box 510 to be displayed to a user. For example, the AI model output could be displayed via a UI provided by the AI platform application 115 or the client application 145.

To test the AI pipeline 500, the user can select the Playground option 550. The playground can open a query box such that the user can test different queries and inputs to the pipeline. A separate pane can show the output of the pipeline. In one example, a package of input queries can be fed into the pipeline as part of the playground. This is further discussed in connection with FIG. 7, below.

Changes to the pipeline can be saved by selected the save button 555. The saved pipeline can then be saved for future retrieval or deployment.

Figure 6:
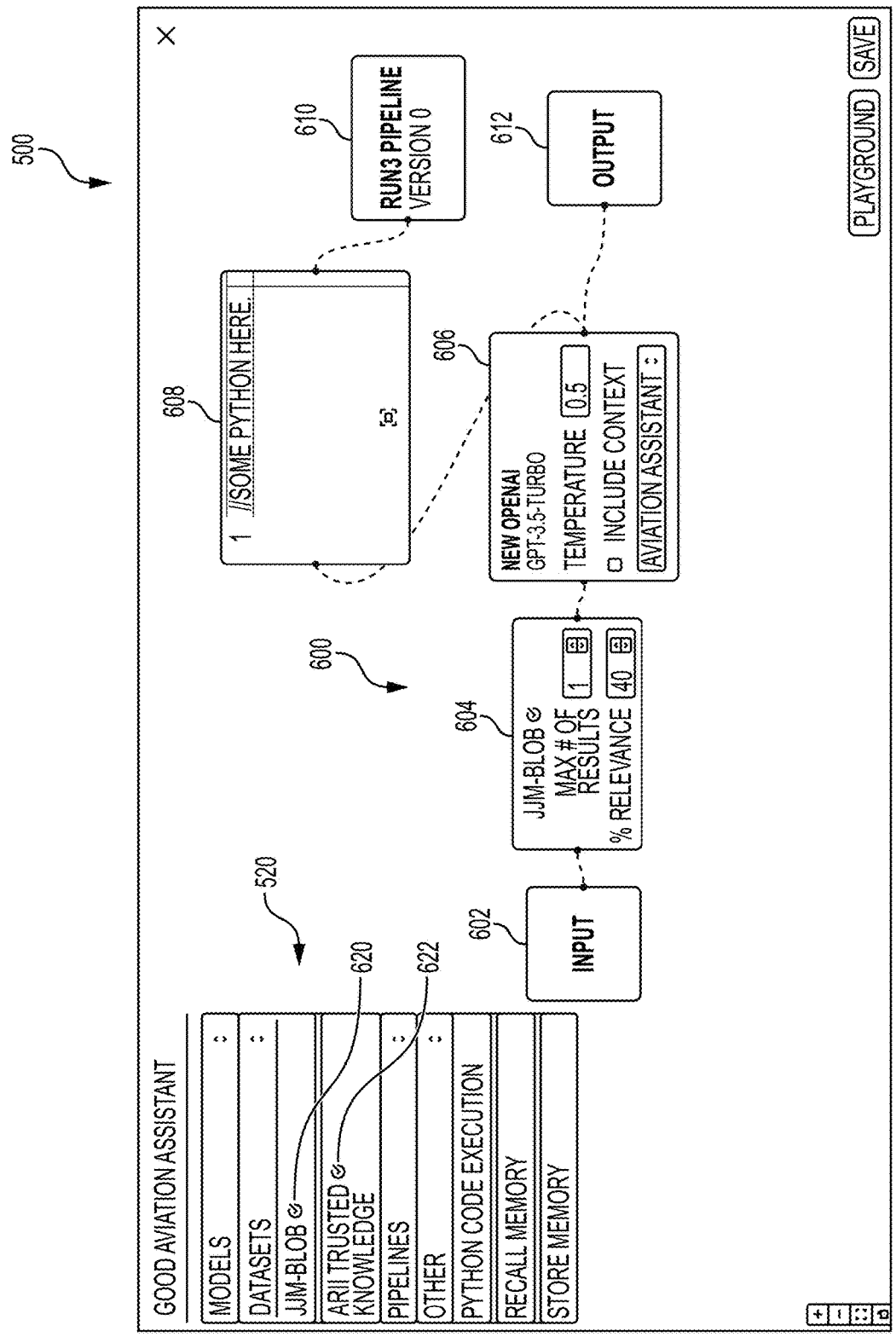
FIG. 6 illustrates how another AI pipeline can be designed using the exemplar UI of FIG. 5, according to various embodiments.

FIG. 6 illustrates how another AI pipeline can be designed using the exemplar UI 500 of FIG. 5, according to various embodiments. As shown, a user can select a "Datasets" drop-down menu and an "Other" drop-down menu in the menu section 520 to view available dataset objects and other available objects, respectively. Illustratively, in the "Datasets" drop-down menu, statuses of a "jjm-blob" dataset object and an "Trusted Knowledge" dataset object are indicated using status indicators 620 and 622, shown as checkmarks. By dragging-and-dropping objects from the menu section 520, a user can design an AI pipeline. For example, to quickly switch from using an outdated AI model to using a new AI model, a user can replace a model object associated with the outdated AI model with a model object associated with the new AI model in an AI pipeline.

As shown, a UI 600 displays a graphical representation of an AI pipeline 600 named "Good Aviation Assistant," and the representation of the AI pipeline 600 includes a box 602 that represents an input object named "Input"; a box 604 that represents a dataset object named "jjm-blob" and permits a user to specify a percentage relevance to use in an embedding search of the dataset and a maximum number of results to output; a box 606 that represents a model object named "New OpenAI" and that permits a user to specify a temperature to use, select to include data from a predefined data source, and select a prompt statements object (shown as a prompt statements object named "Aviation Assistant") to use; a box 610 representing a pipeline object named "Run3 Pipeline"; a box 612 representing an output object; as well as the relationships between objects. In addition, the graphical representation of the AI pipeline 600 includes a box 608 that represents a custom code object and permits a user to input program code for the custom code object. The box 600 can be used to enter any suitable custom code, such as code for post-processing of outputs generated by the AI model of the model object 606, code for other tools, and/or the like. In some embodiments, the user can input any desired program code into a custom code object, such as code for redacting certain information from text data, or code to otherwise modify text data.

The pipeline objects 604, 606, 608 are connected with dashed lines that visually indicate execution linking. The pipeline 600 begins at input block 602 and follows the visualized execution flow according to the established execution linking.

Figure 7:
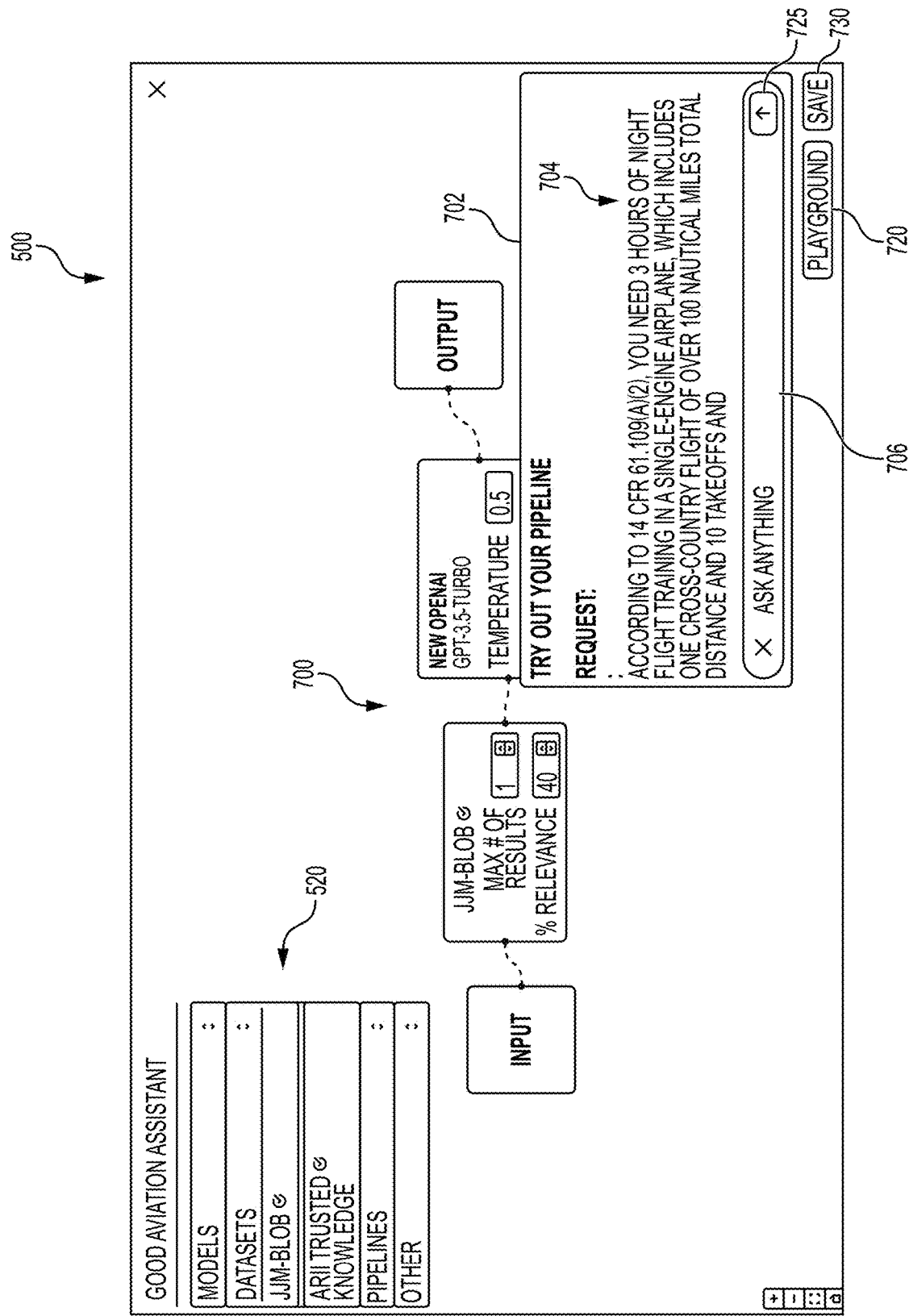
FIG. 7 illustrates testing an AI pipeline using the exemplar UI of FIG. 5, according to various embodiments.

FIG. 7 illustrates testing an AI pipeline using the exemplar UI 500 of FIG. 5, according to various embodiments. As shown, using the menu section 520 of the UI 500, a user has designed an AI pipeline 700 named "Good Aviation Assistant." Illustratively, the UI 500 includes the menu section 520, a representation of the AI pipeline 700, and an overlay section 702, also referred to herein as the "Playground," that permits a user to test the AI pipeline 700. In particular, the user can select the playground button 720, and the overlay section 702 is then presented. The overlay section 702 provides an input field 706 that permits a user to enter a question. The user can submit the question by selecting button 725. Given such a question as input, the AI platform application 115 executes the pipeline 700 to generate an answer to the question. Thereafter, the AI platform application displays an output 704 of the pipeline 700 in the overlay section 702. Accordingly, after designing a pipeline, a user can test the pipeline to understand what outputs the pipeline generates.

Although the testing of one AI pipeline using one user question is shown for illustrative purposes, in some embodiments, the AI platform application 115 can present a UI, referred to herein as a "Battleground," that permits a user to test multiple AI pipelines on the same and/or different inputs and compare outputs generated by the AI pipelines. In some embodiments, the AI platform application 115 can also present a UI that permits a user to test an AI pipeline using multiple different inputs in a batch of inputs (e.g., by computing an average score based on outputs of the multiple inputs) and/or one or more inputs that include various conversation histories (including conversation histories generated by previous use of the AI pipeline). In some embodiments, the AI platform application 115 can also "step through" objects of an AI pipeline, executing the objects one by one and displaying the output of each object after execution so that a user can debug the AI pipeline and objects therein. Battleground functionality can be used to test new models and compare results to previous models. The UI can show differential results in an easy to digest way.

In one example, a semantic comparison of the results is performed by using a comparison pipeline. The comparison pipeline can score the semantic similarity of each result in a batch. This can be based on sending both results to an LLM, or by vectorizing the results with an embedding model and comparing the vectors. Comparing the results at each step of a batch of queries can be helpful in determining and visualizing where the semantic difference occurs.

In one example, when a semantic difference occurs, the battleground pipeline can automatically request an additional prompt that would cause the new model to track the semantic meaning of the outputs from the prior model.

In one example, the battlefield can be performed against a historical batch. The answers of the historical batch can be saved. The same questions from the historical batch can be fed into the current pipeline. The comparison pipeline can score the semantic similarity of each result in a batch. This can be useful, for example, in detecting semantic drift for the same model without an obvious update. Such differences can arise, for example, when system prompts at the AI model are changed without the public being aware.

AI pipelines can run in real time. For example, one to ten test cases can be performed based on live input. Or the AI pipeline can run batch jobs. For example, the AI platform can run a new background removal model on existing 100K images.

Figure 8:
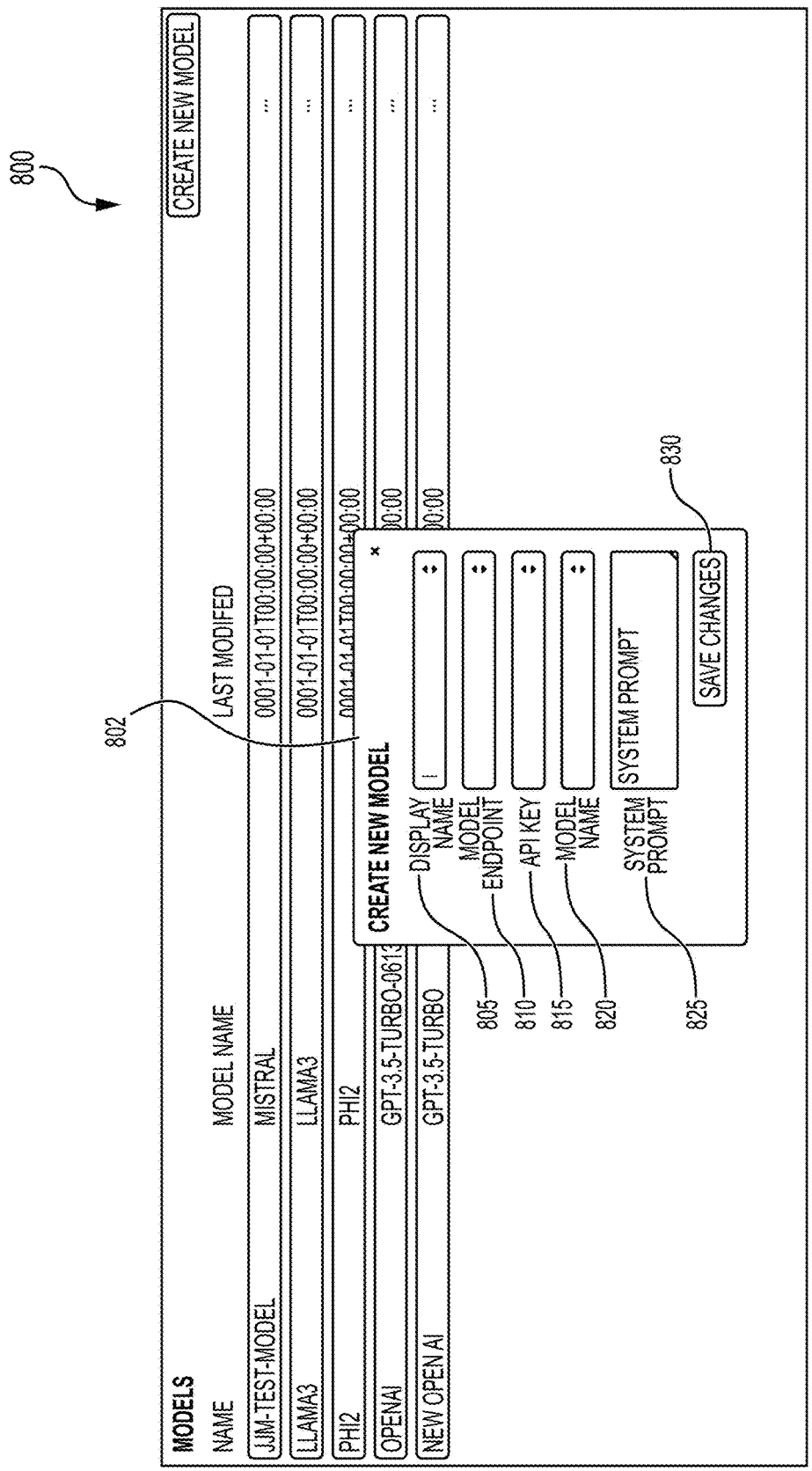
FIG. 8 illustrates an exemplar user interface (UI) for defining a model object, according to various embodiments.

FIG. 8 illustrates an exemplar UI for defining a model object, according to various embodiments. As shown, a UI 800 includes an overlay section 802 named "Generate New Model" that permits a user to define a new model object. Illustratively, the new model object can be defined by inputting, via the overlay section 802, parameters including a displayed name 805 of the model object, and a model endpoint 810 (e.g., a universal resource locator (URL) of an API endpoint for accessing an AI model, a pointer to a local model, or the like) where an AI model for the model object can be accessed. The AI platform 115 can generate an API key 815f for authenticating the AI platform application 115 or other application that calls an API to access the AI model, a name 820 of the AI model, and a system prompt message 825 to include in a context window of each prompt input into the AI model. Given such input parameters, when saved via button 830, the AI platform application 115 generates a new model object. The AI platform application 115 can generate the new model object in any technically feasible manner in some embodiments. For example, in some embodiments, the AI platform application 115 can add, to a database, one or more entries associated with the new model object and including the input parameters. As another example, in some embodiments, the AI platform application 115 can generate code (e.g., using a template and the input parameters) for accessing and utilizing the specified AI model. The generated code can then be executed by the AI platform application 115 and/or deployed to client applications (e.g., client application 145).

Figure 9:
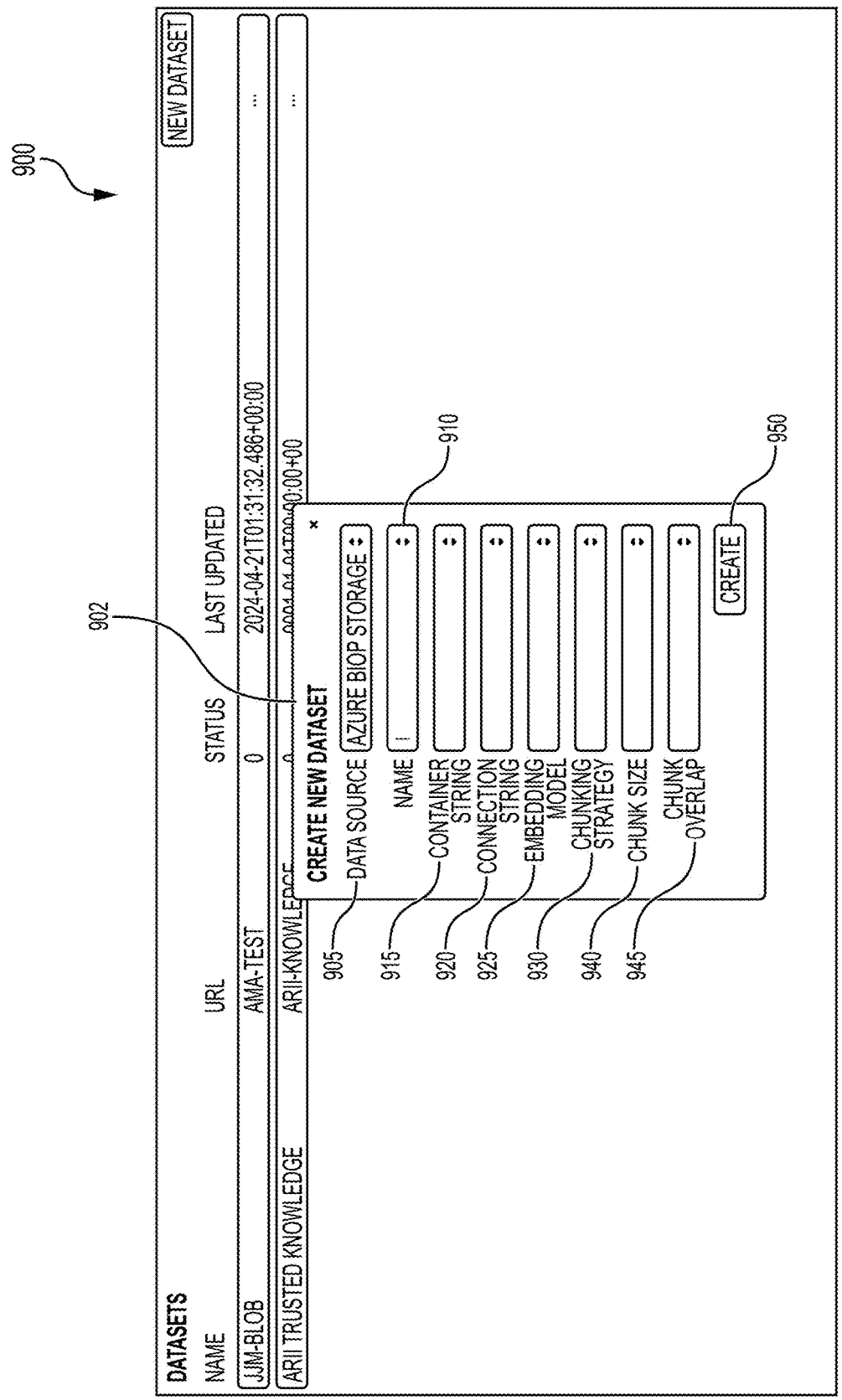
FIG. 9 illustrates an exemplar UI for defining a dataset object, according to various embodiments.

FIG. 9 illustrates an exemplar UI for defining a dataset object, according to various embodiments. As shown, a UI 900 includes an overlay section 902 that permits a user to define a new dataset object. Illustratively, the new dataset object can be defined by selecting the dataset in the data source field 905. The UI allows for inputting, via the overlay section 902, parameters including a name 910 of the dataset object, a name of a container 915 storing a data source, a connection string 920 for connecting to the container, an embedding model 925 for embedding chunks of text data from the data source. The overlay section 902 an also include a chunking strategy 930 for dividing the text data into chunks, a chunk size 940 specifying the size of each chunk (which can be dynamic), and a chunk overlap 945 specifying by how much chunks overlap. The chunk size can actually be a type, such as "paragraph" or "sentence." This can allow for chunking different datasets according to what will provide the most useful semantic meaning. When the user is done making selections, the user can select button 950 to begin the vectorizing of the dataset.

Given such input parameters, the AI platform application 115 instantiates a new dataset object. The AI platform application 115 can instantiate the new dataset object in any technically feasible manner in some embodiments. For example, in some embodiments, the AI platform application 115 can process text data (e.g., documents) from the data source according to the chunking strategy to divide such text data into chunks having the chunk size and overlapping by the chunk overlap. Then, the AI platform application 115 can use the specified embedding model to generate embeddings of the chunks and store the embeddings in, e.g., the vector database 122 for use in embedding searches. In addition, the AI platform application 115 can add, to a database, one or more entries associated with the new dataset object and including one or more of the parameters, and/or the AI platform application 115 can generate code (e.g., using a template and the input parameters) for performing embedding searches on the generated embeddings. The generated code can then be executed by the AI platform application 115 and/or deployed to client applications (e.g., client application 145).

Figure 10:
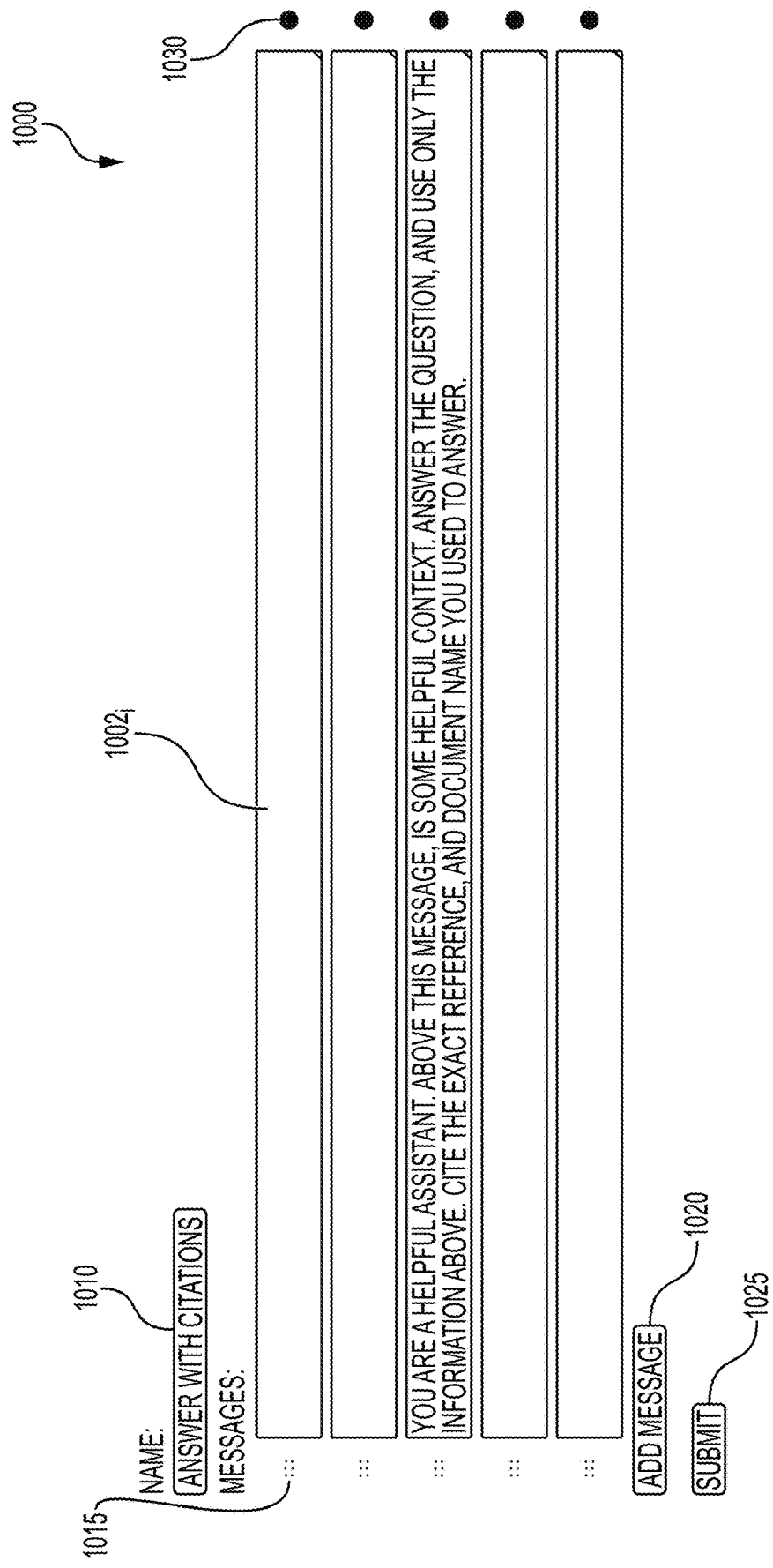
FIG. 10 illustrates an exemplar UI for defining a prompt object, according to various embodiments.

FIG. 10 illustrates an exemplary UI for defining a prompt object (also called a "prompt package" or "prompts"), according to various embodiments. As shown, a UI 1000 permits a user to define a new prompt statements object. Illustratively, the new prompt statements object can be defined by inputting, via input fields 1002 (referred to herein collectively as input fields 1002 and individually as an input field 1002) of the UI 1000, one or more statements to be included in the context window of a prompt that is input into an AI model.

The UI 100 permits the user to add, edit, and/or remove prompt statements. To add a prompt, the user can select the add message button 1020. In this example, the prompt package is named 1010 "answer with citations." When the user is done editing the prompt package, they can select the submit button 1025 to save any changes.

In addition, the UI 100 permits the user to re-order the prompt statements, which can affect the behavior of an AI model. The user can reorder the prompts by dragging row indicator 1015 to a different row. Given the user-input prompt statement(s), the AI platform application 115 can add, to a database, one or more entries associated with the new prompt statements objects and including the prompt statement(s), and/or the AI platform application 115 can generate code for performing generating prompts that include prompt statements. The generated code can then be executed by the AI platform application 115 and/or deployed to client applications (e.g., client application 145).

Figure 11:
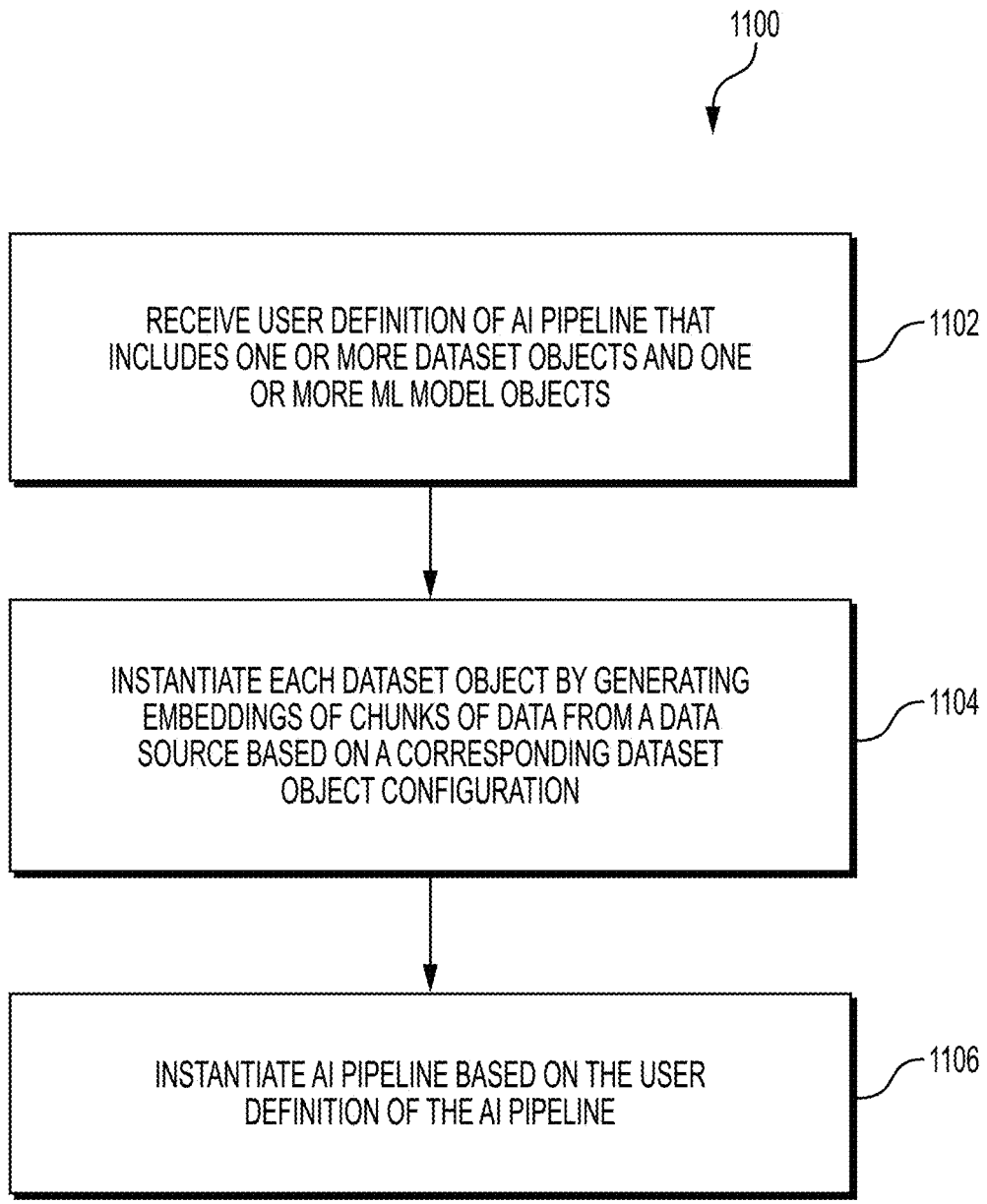
FIG. 11 is a flow diagram of method steps for generating an AI pipeline, according to various embodiments.

FIG. 11 is a flow diagram of method steps for generating an AI pipeline, according to various embodiments. Although the method steps are described in conjunction with the systems of FIGS. 1-10, persons skilled in the art will understand that any system configured to perform the method steps in any order falls within the scope of the present embodiments.

As shown, a method 1100 begins at step 1102, where the AI platform application 115 receives a user definition of an AI pipeline that includes one or more dataset objects and one or more model objects. In some embodiments, the AI platform provides one or more UIs that permit users to (1) define objects by specifying associated parameters, and (2) drag-and-drop and connect such objects to define an AI pipeline, as described above in conjunction with FIGS. 5-10.

Before allowing a UI connection between objects when building a pipeline, the AI platform can validate that the output of the first block being connected matches the expected input format of the block it is being connected to. If it does not, the AI platform can indicate the format mismatch on the UI and either prevent the connection of the two blocks in the UI or allow the connection but flagged it as an error condition. In one example, the UI suggests an available format conversion code block as an intermediate step between the two blocks. This can be the case when a code object exists for reformatting the output of the first block into a usable format for the second block.

At step 1104, the AI platform application 115 instantiates each of the dataset object(s) by generating embeddings of chunks of data from a data source based on a corresponding dataset object configuration.

At step 1106, the AI platform application 115 instantiates an AI pipeline based on the user definition of the AI pipeline. In some embodiments, the AI platform application 115 can instantiate the AI pipeline in any technically feasible manner, such as generating program code for the AI pipeline and/or adding one or more entries associated with the AI pipeline to a database for future use, similar to the description above in conjunction with instantiating objects in FIGS. 8-10.

Figure 12:
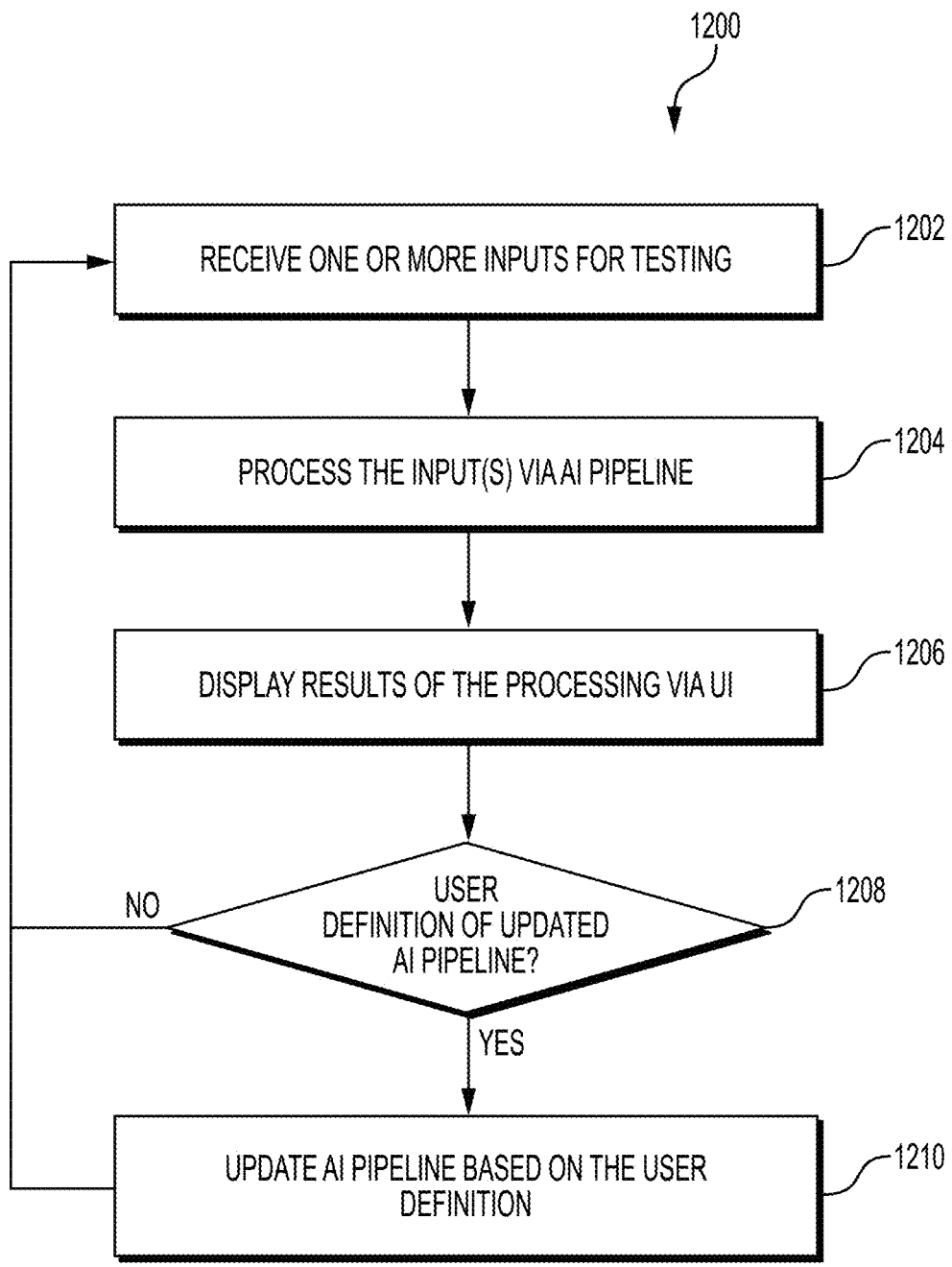
FIG. 12 is a flow diagram of method steps for testing an AI pipeline, according to various embodiments.

FIG. 12 is a flow diagram of method steps for testing an AI pipeline, according to various embodiments. Although the method steps are described in conjunction with the systems of FIGS. 1-10, persons skilled in the art will understand that any system configured to perform the method steps in any order falls within the scope of the present embodiments.

As shown, a method 1200 begins at step 1202, where the AI platform application 115 receives one or more inputs for testing an AI pipeline. In some embodiments, the input(s) can be received via a UI, such as the "Playground" UI described above in conjunction with FIG. 7. In some embodiments, multiple test inputs can be received, such as in a batch. In some embodiments, the inputs can include a conversation history.

At step 1204, the AI platform application 115 processes the input(s) received at step 1202 via the AI pipeline that is being tested.

At step 1206, the AI platform application 115 causes results of the processing to be displayed via a UI. For example, the AI platform application 115 could display the results of the processing via the "Playground" UI described above in conjunction with FIG. 7.

At step 1208, if the AI platform application 115 receives a user definition of an updated AI pipeline, then the method 1200 continues to step 1210, where the AI platform application 115 updates the AI pipeline based on the user definition.

After the AI platform application 115 updates the AI pipeline, or if the AI platform application 115 does not receive a user definition of an updated AI pipeline, the method 1200 returns to step 1202, where the AI platform can receive more input(s).

Figure 13:
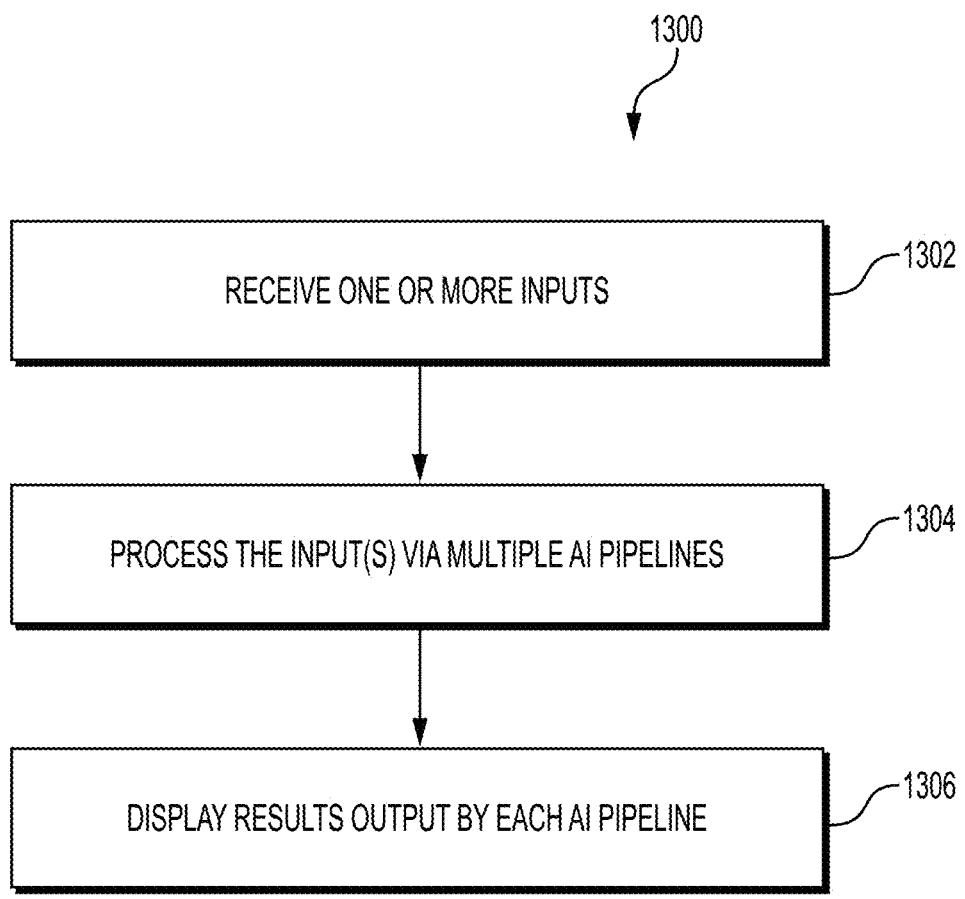
FIG. 13 is a flow diagram of method steps for comparing AI pipelines, according to various embodiments.

FIG. 13 is a flow diagram of method steps for comparing AI pipelines, according to various embodiments. Although the method steps are described in conjunction with the systems of FIGS. 1-10, persons skilled in the art will understand that any system configured to perform the method steps in any order falls within the scope of the present embodiments.

As shown, a method 1300 begins at step 1302, where the AI platform application 115 receives one or more inputs. In some embodiments, the input(s) can be received via a UI. In some embodiments, multiple test inputs can be received, such as in a batch. In some embodiments, the inputs can include a conversation history.

At step 1304, the AI platform application 115 processes the input(s) via the multiple AI pipelines. In some embodiments, the input(s) can be processed in parallel using the multiple AI pipelines that are being compared.

At step 1306, the AI platform application 115 causes results output by each AI pipeline to be displayed. Thereafter, a user, such as an IT administrator, can modify the definitions of one or more of the AI pipelines, select one of the AI pipelines for use, etc., as appropriate.

Figure 14:
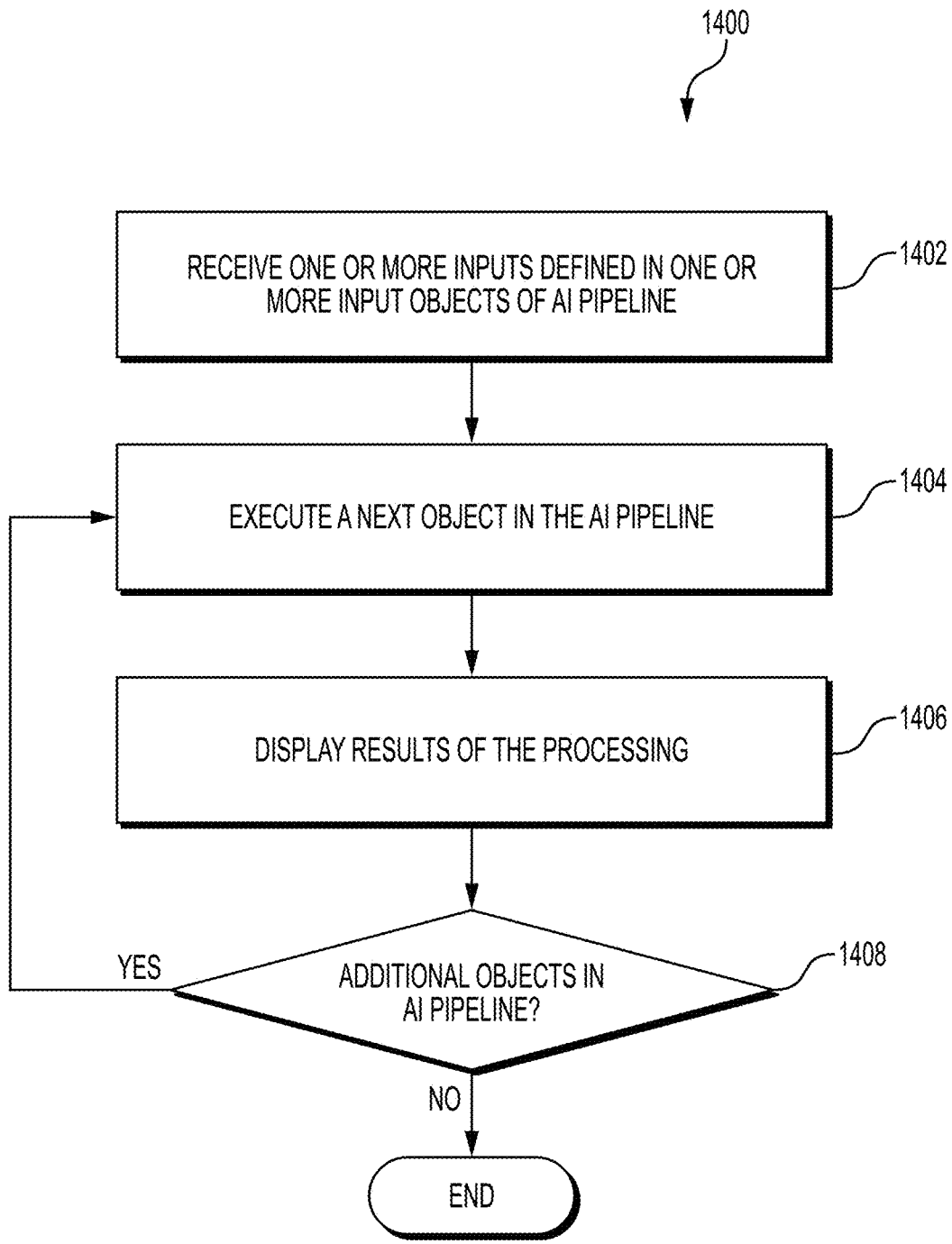
FIG. 14 is a flow diagram of method steps for debugging an AI pipeline, according to various embodiments.

FIG. 14 is a flow diagram of method steps for debugging an AI pipeline, according to various embodiments. Although the method steps are described in conjunction with the systems of FIGS. 1-10, persons skilled in the art will understand that any system configured to perform the method steps in any order falls within the scope of the present embodiments.

As shown, a method 1400 begins at step 1402, where the AI platform application 115 receives one or more inputs that are defined in one or more input objects of an AI pipeline.

At step 1404, the AI platform application 115 executes a next object in the AI pipeline. That is, the AI platform application 115 "steps through" objects of the AI pipeline and executes the objects one by one.

At step 1406, the AI platform application 115 causes results of the execution at step 1404 to be displayed to a user.

At step 406, if there are no additional objects in the AI pipeline, then the method 1400. On the other hand, if there are additional objects in the AI pipeline, then the method 1400 returns to step 1404, where the AI platform application 115 again executes a next object in the AI pipeline.

Figure 15:
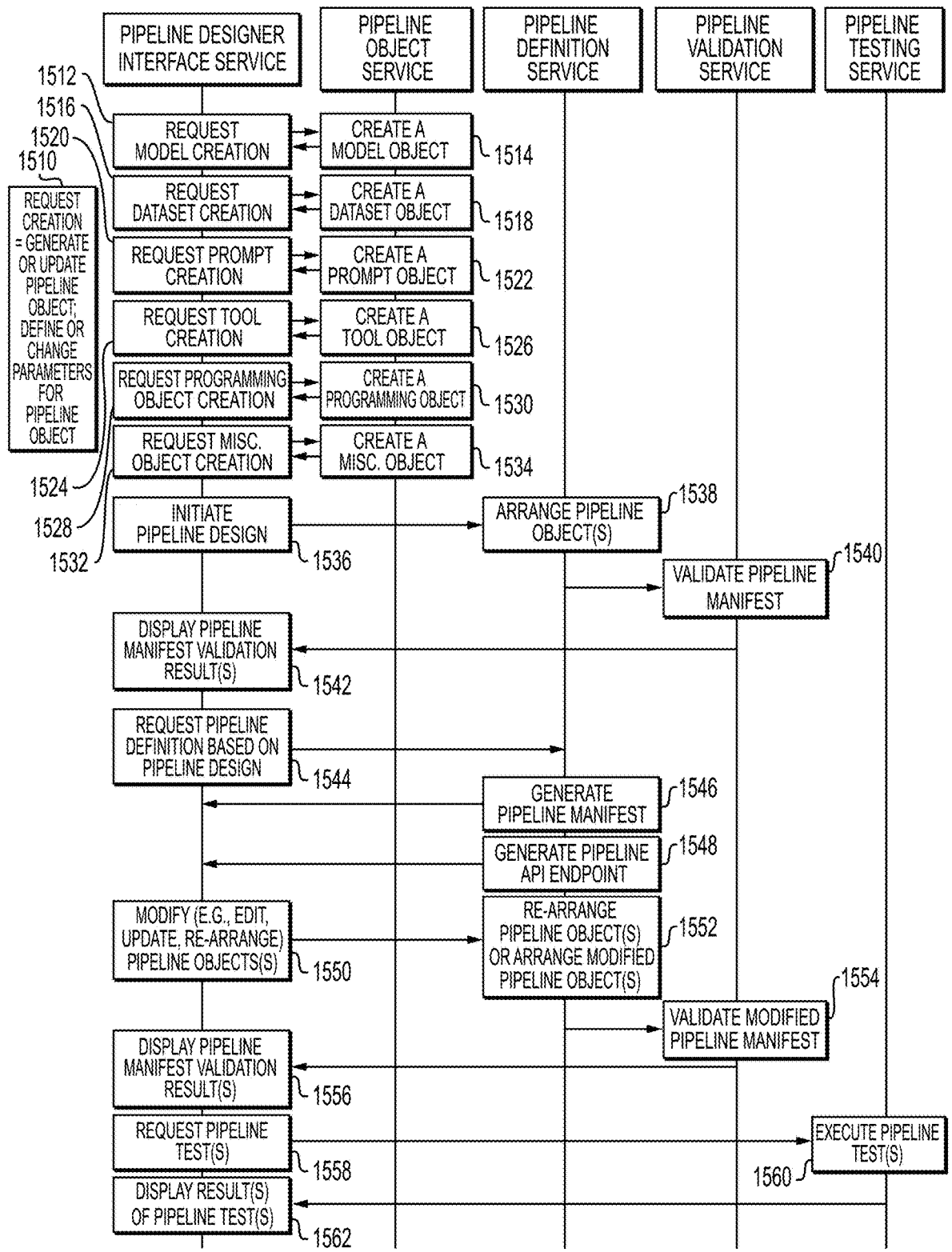
FIG. 15 is a sequence diagram of method steps for designing an AI pipeline, according to various embodiments.

FIG. 15 is a sequence diagram of method steps for designing an AI pipeline, according to various embodiments. Various services are displayed at the top. These services can execute on a server device 110, 170 or on a computing device 140.

A series of stages 150 are performed as part of a request to update pipeline objects. The edit could be any change to parameters of the pipeline object or the AI pipeline itself.

At stage 1512, the pipeline designer interface service can receive a request for model creation. This can mean dragging a model icon into the UI, in an example. In another example, the model is created using a UI interface such as in FIG. 8. Various parameters discussed in connection with FIG. 8, such as display name and model name can be part of the model creation request.

The request can also include things like dependencies and management policies that the administrator applies to the model. Using the UI, the user can define which dependencies and management policies apply.

In response to the request, a pipeline object service can create the model object at stage 1514. This can include ensuring that the user and device are compliant with the management policies and have permission to create the model object.

At stage 1516, the pipeline designer interface service can receive a request for dataset creation. The request can be based on the UI discussed in FIG. 9. Alternatively, a dataset can be dragged onto the UI from a dropdown menu of potential datasets, in an example.

In response to the request, a pipeline object service can create the dataset object at stage 1518. This can include ensuring that the user and device are compliant with the management policies and have permission to create the dataset object.

At stage 1520, the pipeline designer interface service can receive a request for prompt creation. The request can be based on the UI discussed in FIG. 10. Prompt packages can have a maximum number of prompts that can be dictated based on user profile attributes, in an example. Alternatively, the maximum number of prompts can be based on current allowable query sizes for AI models being utilized by the AI pipeline.

In response to the request, a pipeline object service can create the prompt object at stage 1522. This can include ensuring that the user and device are compliant with the management policies and have permission to create the prompt object.

At stage 1524, the pipeline designer interface service can receive a request for tool creation. The tool can be a third-party tool that is ingested by the AI platform through an ingestion pipeline. The ingestion can include creating code for interacting with an API of the tool in an example. Any of the various tool parameters discussed herein can be utilized.

In response to the request, a pipeline object service can create the tool object at stage 1526. This can include ensuring that the user and device are compliant with the management policies and have permission to create the tool object.

At stage 1528, the pipeline designer interface service can receive a request for creating a programming object. The programming object can be code that is uploaded to the AI platform through, such as in an ingestion pipeline. The ingestion can include creating code for insertion into the pipeline.

In response to the request, a pipeline object service can create the tool object at stage 1530. This can include ensuring that the user and device are compliant with the management policies and have permission to create the tool object.

A similar process works for onboarding miscellaneous objects. The pipeline designer can define the miscellaneous object at stage 1532, and the pipeline object service can create the miscellaneous object at stage 1534.

At stage 1536, the pipeline designer interface service can initiate pipeline design. This can occur from opening a preexisting pipeline, selecting an option for a new pipeline, or saving a new pipeline.

At stage 1538, the pipeline distribution service can arrange the pipeline objects for display at the UI. This can also include creating a pipeline manifest that represents the pipeline and object arrangement. An example pipeline manifest is shown below:

```
"id": "6b2daba2-cdab-4ef8-99fc-98c70f70d41c",
"name": "Test dataset pipeline",
"executionName": "test_dataset_pipeline",
"description": "",
"version": 0,
"steps": [
  {
    "stepType": "inputStep",
    "stepId": "589b8d3d-5073-4348-bc62-7a8ac39901ad",
    "position": {
      "id": "a24fc8c1-29a1-421e-9aa1-72116bf3b7b7",
      "x": 200,
      "y": 450,
      "tenantId": "2ce49ae0-c3ff-421a-91b7-830d0c73b348",
      "createdAt": "2024-06-07T22:02:57.085196Z",
      "updatedAt": "2024-06-07T22:02:57.085196Z"
    },
```

-continued

```
    "dependencies": [ ],
    "pipelineId": "6b2daba2-cdab-4ef8-99fc-98c70f70d41c",
    "tenantId": "2ce49ae0-c3ff-421a-91b7-830d0c73b348",
    "createdAt": "2024-06-07T22:02:57.084561Z",
    "updatedAt": "2024-06-07T22:02:57.084561Z"
  },
  {
    "dataSource": "6ebb6214-de23-4245-9430-77308d28fce5",
    "topK": 5,
    "relevanceThreshold": 50,
    "databaseType": "pinecone",
    "pineconeApiKey": "f8803-4c5d-9a6d-34a4fb543fc7",
    "pineconeIndexName": "",
    "stepType": "dataSearch",
    "stepId": "8836c64a-3db7-4d1f-ac5d-be920cba1eca",
    "position": {
      "id": "d050338f-6a10-4e23-98bf-8a2dd46747ac",
      "x": 472,
      "y": 391,
      "tenantId": "2ce49ae0-c3ff-421a-91b7-830d0c73b348",
      "createdAt": "2024-06-07T22:02:57.090006Z",
      "updatedAt": "2024-06-07T22:02:57.090006Z"
    },
    "dependencies": [
      "589b8d3d-5073-4348-bc62-7a8ac39901ad"
    ],
    "pipelineId": "6b2daba2-cdab-4ef8-99fc-98c70f70d41c",
    "tenantId": "2ce49ae0-c3ff-421a-91b7-830d0c73b348",
    "createdAt": "2024-05-23T16:51:18.662126Z",
    "updatedAt": "2024-05-23T16:51:18.714447Z"
  },
  {
    "stepType": "outputStep",
    "stepId": "c51e30e9-bcfe-4703-8a77-62863fffe7ce",
    "position": {
      "id": "155e601d-6dd5-48d6-9889-28b44fc91719",
      "x": 800,
      "y": 450,
      "tenantId": "2ce49ae0-c3ff-421a-91b7-830d0c73b348",
      "createdAt": "2024-06-07T22:02:57.08659Z",
      "updatedAt": "2024-06-07T22:02:57.08659Z"
    },
    "dependencies": [
      "8836c64a-3db7-4d1f-ac5d-be920cba1eca"
    ],
    "pipelineId": "6b2daba2-cdab-4ef8-99fc-98c70f70d41c",
    "tenantId": "2ce49ae0-c3ff-421a-91b7-830d0c73b348",
    "createdAt": "2024-06-07T22:02:57.08644Z",
    "updatedAt": "2024-06-07T22:02:57.08644Z"
  }
],
"tenantId": "2ce49ae0-c3ff-421a-91b7-830d0c73b348",
"createdAt": "2024-06-07T22:02:57.079139Z",
"updatedAt": "2024-06-07T22:02:57.079139Z"
}
```

The manifest can be a JSON or other format. In this example, the "id" is a unique identifier to reference the pipeline. "Name" indicates a pipeline name defined by an administrator, in this case "Test dataset pipeline." The executionName indicates what the pipeline is called in an execution environment, and can also be defined by an administrator. Additional description and version fields can track additional information about the AI pipeline Each step can refer to a pipeline object. In this example, the pipeline manifest includes steps for inputStep (an input object), a dataSearch of a dataSource (searching a dataset object), and an outputStep (an output object). Each step can have an identifier such that it can be accessed from a datastore by the pipeline designer or pipeline engine during pipeline deployment.

The position of the step can also be stored, with an identifier of the position, and coordinates for placing an icon on the UI to represent the step. The position coordinates can include an X location and a Y location that correspond to placement of the pipeline object within the UI. This can allow for recalling the visual arrangement of the pipeline at a future time. For example, the position coordinates for the data source in the above example manifest are x: 472 and y: 391, which indicate X and Y screen positions within the UI.

The steps in the example manifest also include a dependencies field. This field can contain multiple identifiers, which the pipeline engine and validation service can use to determine which other steps or actions the current step (pipeline object) must wait on before completion. Zero, one, or multiple dependencies can be assigned to a pipeline object. The pipeline engine can look up the dependencies using the identifiers in the dependencies field.

The dependencies can include conditional events. For example, searching a dataset can be dependent on ingesting the dataset first. However, if a threshold period of time passes before the dataset is ingested, and a prior version of the dataset is already ingested at a date that falls after a recency threshold, then the step can move forward with searching the previously ingested prior version of the dataset.

Another example dependency is as follows. The pipeline engine can check with the ingestion service to get an estimate of how long it will take for the dataset to be ingested. That estimate can be compared against a threshold maximum waiting time, which can be based on a timing parameter for how long the pipeline can take to complete. A synchronous pipeline will typically have a much shorter time requirement than an asynchronous pipeline, such as a pipeline that can run at off-peak times in the night. If the estimate is within a percentage, such as 80%, of the maximum waiting time, then the pipeline engine can wait on the ingestion. However, if that time period elapses, the pipeline engine can check again with the ingestion service to determine how much longer the ingestion will take. This can be compared against an additional fallback threshold to determine whether to keep waiting. For example, if the ingestion is nearly complete, such as more than the percentage (e.g., 80%) of time waited so far, then the pipeline engine can continue to wait for the ingestion to complete. Otherwise, the pipeline engine can at that point decide to search the prior version of the dataset. The thresholds in this example can all be configured by an administrator when creating or editing dependency rules.

Nested dependencies such as this can exist for steps other than dataset ingestion as well. Dependencies can relate to current costs and execution times for AI models. For example, in an asynchronous pipeline, the pipeline engine can check projected costs to use a model at different times within the maximum execution window. These costs can be obtained by a cost pipeline that polls the AI services at intervals for current and future cost estimates. The dependency can cause the pipeline engine to wait until a lowest cost time, or until the soonest time when the cost is projected to be below a maximum cost threshold.

As yet another example dependency, if four different LLMs are available for use to perform a single step within an AI pipeline, the AI pipeline can check average execution times and costs for the LLMs within a most recent time period. These numbers can be polled and stored by a cost pipeline running at the platform. A first LLM (selected as preferred) can be used dependent on its cost and execution time being within a threshold closeness to cheaper costs and/or times of the other available LLMs. Otherwise, the cheapest or fastest LLM is selected.

Continuing with the pipeline manifest, each step (pipeline object) can also include a tenant ID. Multiple tenant IDs are possible. The tenant ID can be used to determine which tenants can access the pipeline object. The platform can be multi-tenant, such that tenant assets can be easily segmented and isolated from other tenants. When a tenant utilizes the platform, they can create their own pipelines and pipeline objects that are stored with the corresponding tenant ID. These objects are not accessible by other tenants unless the creator elects to allow such accessibility.

A tenant can be an enterprise customer. Alternatively, the tenant ID can represent a subtenant of the enterprise customer. This can allow the enterprise customer to white label the platform and provide the AI design and administration capabilities to its own customers. These subtenants can be limited to less pipeline objects than the enterprise customer itself. For example, the enterprise customer can have its own prompt packages, but its subtenants can still create additional prompt packages that are not shared with the other subtenants.

The manifest steps can also include dates that track when the step was created and modified, such as in the createdAt and updatedAt fields.

At stage 1540, the pipeline validation service can validate the pipeline manifest. This can involve ensuring that the manifest, which defines the pipeline objects (e.g., steps) of an AI pipeline, adheres to the required format, contains valid configurations, and meets the predefined standards for successful execution. This can include syntax validation, validation of the manifest format against a schema, and validation that all required parameter fields are in the manifest. Values of the parameter fields can be checked to ensure that they fall within an acceptable range for that parameter. The AI pipeline can also ensure values match the expected types (e.g., strings, integers, lists).

In addition, the pipeline validation service can ensure all referenced objects (e.g., data sources, processing steps, models) are defined and available to the user or tenant within the AI platform. The pipeline validation can also check for compatibility, including that pipeline objects (and particularly adjacent objects are compatible with each other (e.g., input/output data formats).

The pipeline validation service can also ensure that all dependencies between objects are properly defined and resolvable. Dependencies can include preprocessing that must occur before a particular object, in an example. Dependencies can be configured according to administrative rules. And then these rules can be referenced when validating the dependencies of the AI pipeline. Additionally, the AI pipeline can ensure that the execution order respects dependencies (e.g., a model cannot be trained before the data preprocessing step is completed).

By implementing these validation steps, an AI platform can ensure that the AI pipeline manifest is correctly defined, properly configured, and ready for execution, minimizing the risk of errors and ensuring smooth operation.

At stage 1542 the designer interface service can display the pipeline manifest validation results in the UI.

At stage 1544 the UI can request a pipeline definition from the pipeline definition service based on the user selecting the pipeline design. This can include sending a pipeline identifier to the pipeline definition service. In response, at stage 1546, the pipeline definition service can generate the pipeline manifest. The pipeline definition service can also generate a pipeline API endpoint at stage 1548. A corresponding URL and key can be sent back to the pipeline designer interface in an example.

The pipeline then displays in the UI. At stage 1150, the user can modify the AI pipeline. The modification can be an edit, update, or rearrangement of pipeline objects or parameters. Even dragging one of the pipeline objects to a different place on the UI is a modification.

Pipeline UI builder can suggest blocks, connections, prompts, and other pipeline objects in real time as autocomplete suggestions. For example, the UI can offer to automatically link a dataset and an LLM when dragging blocks on the UI canvas. Additionally, the UI can offer to use a specific prompt for the selected LLM.

The modifications are sent to the pipeline definition service. At stage 1552, that service can rearrange pipeline objects or arrange modified pipeline objects. This can include changing parameters, AI services, and coordinate values in the manifest. At stage 1554, the pipeline validation service validates the modified manifest.

At stage 1556, the pipeline manifest validation results are displayed on the UI.

At stage 1558, a request is made to test the pipeline. This could be as a result of selecting a playground or battlefield button. A pipeline testing service is notified. The pipeline testing service can execute the AI pipeline at stage 1560. Again, this can be a playground or battleground, both of which have been discussed previously. The results of the tests then display at stage 1562.

Figure 16:
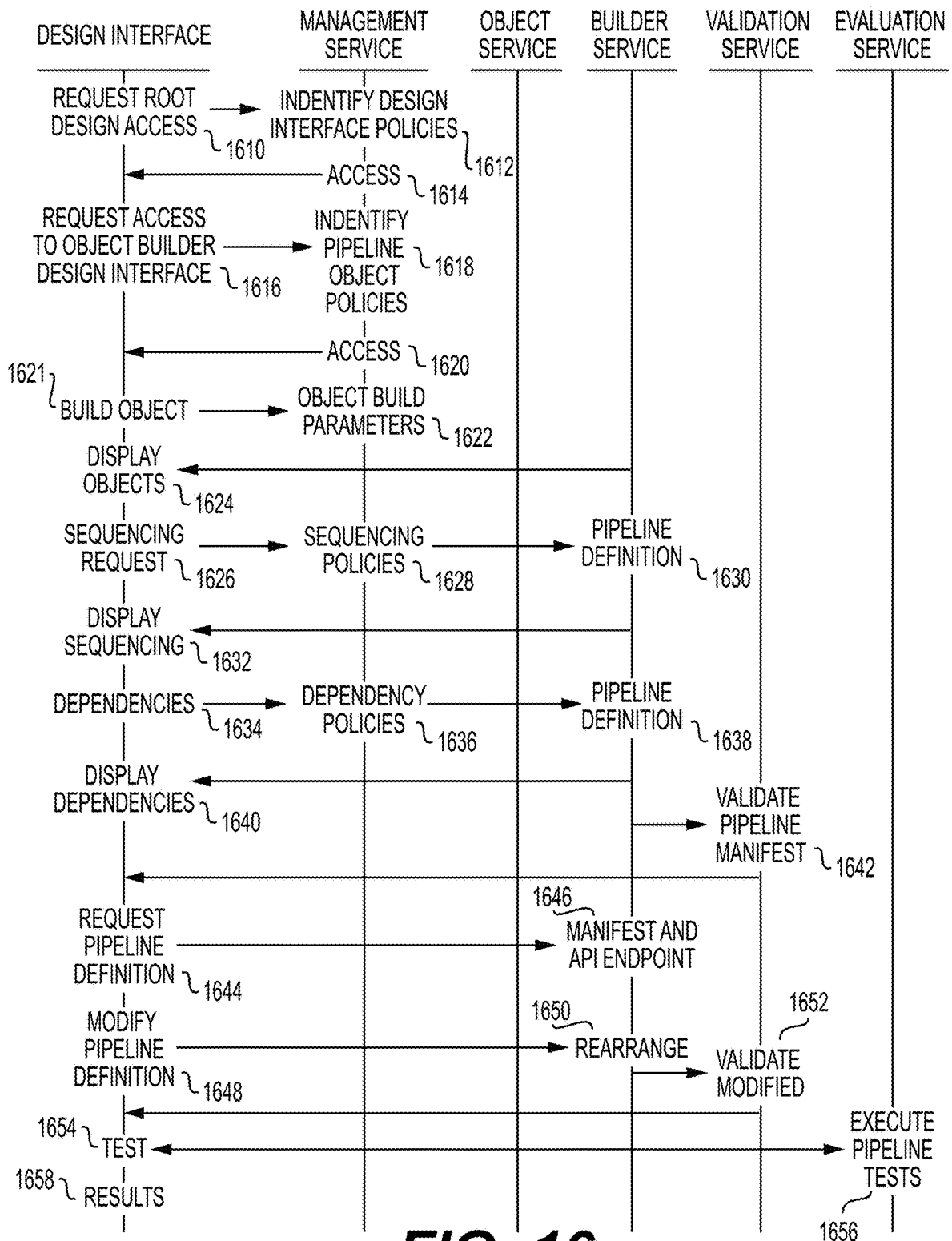
FIG. 16 is a sequence diagram of method steps for designing an AI pipeline, according to various embodiments.

FIG. 16 is a sequence diagram of method steps for designing an AI pipeline, according to various embodiments. A UI for designing pipelines (the design interface), a management service, object service, builder service, validation service, and evaluation service all execute at an AI platform.

At stage 1610, the AI design interface requests root access from a management service. This can include seeking the highest level of permissions within the design UI. This access can grant the administrative user full control over all pipeline objects, policies, and parameters. The permission can also include access to editing management policies and user permissions, modifying global settings, and accessing all advanced tools and features.

At stage 1612, the management service can identify design interface policies. The management service can identify the relevant management policies based on contextual data, such as the user making the request, the user's role in the enterprise, groups the user belongs to, the tenant, and the user's device configuration and state. Both historical and current device configurations can be considered by the management service. Other compliance information, such as the platform infrastructure configuration and state, network configuration and state, and any other compliance information explained herein can be considered by the management service.

Based on these considerations, the management service can grant varying levels of access at stage 1614. The design interface can then display the access level and execute various security measures. The design interface can authorize a connection to the user's computing device 140. Again, based on the access level, different portions of the design interface may be available to the user.

At stage 1616, the design interface can identify a request to access an object builder design interface. The object builder interface can be used for creating, modifying, updating, or deleting pipeline objects and parameters. In response, the management service can identify pipeline object policies associated with the access request at stage 1618. Similar information can be considered as in stage 1614. A pipeline object policy can be used to determine authorized pipeline object design parameters. The determination can be based on the user's credentials, device configuration, and compliance information.

Varying levels of access can be granted at stage 1620. The UI can then display the access level. The object builder interface allows users to create and configure specific components or objects within the AI platform, such as AI models, AI pipelines, and preprocessing steps. Users can define the properties, parameters, and relationships of these objects, tailoring them to fit specific requirements and workflows.

At stage 1621, a request to build one or more pipeline objects can be received at the design interface. The request can be defined by inputs of object parameters in the UI. The request can be based on the upload of a dataset, the integration of a toolset, or any other request to create a new pipeline object.

At stage 1622, the management service identifies a pipeline object policy associated with the request. The policy can be based on the request itself, the user profile information (e.g., group, role, tenant, etc.), device configuration and state, the device type, platform processing configuration and state, platform storage configuration and state, and network configuration and state.

Based on the identified pipeline object policy, authorized object build parameters are determined at stage 1622 and passed to an object service.

The object service returns information to the UI that allows for the display of the requested created object at stage 1624.

At stage 1626, the UI requests sequencing for the pipeline objects. A request to establish sequencing among AI pipeline objects involves defining the order in which components or steps within an AI pipeline are executed. This sequencing ensures that data flows correctly through the pipeline and that each processing step occurs in the correct order. For example, data preprocessing must occur before a query is sent to an LLM in some pipelines. Sequencing can also take into account dependencies.

Implementing sequencing can be done using configuration files (e.g., YAML, JSON) or workflow orchestrators to manage and enforce the sequence. The UI can allow users to define the sequence by connecting components in the desired order. Proper sequencing ensures data integrity, reduces the risk of errors, and improves the reliability and maintainability of the AI pipeline. By clearly defining the order of execution, each step receives the correct input and produces the expected output, facilitating a smooth and efficient pipeline operation.

In response to the sequencing request, the management service identifies and effectuates sequencing policies at stage 1628. The sequencing is then used to create or modify a pipeline definition by a builder service at stage 1630. Although not shown in the figure, this can also cause modification to the pipeline manifest, which can be revalidated by the validation service.

At stage 1632, the UI displays the sequencing. This can include displaying the various pipeline objects of the AI pipeline, with connections between the input and output of the pipeline.

At stage 1634, the user can add dependencies to objects in the pipeline, or an object parameter or policy object can indicate a dependency. At stage 1636, the management service applies dependency policies (also called "dependency rules") to one or more of the pipeline objects.

Designing an AI pipeline can include establishing various dependency policies that define how components or steps interact and rely on each other to ensure efficient and correct operation. Sequential dependencies mandate that one step must be completed before the next begins, ensuring tasks are executed in a specific order, such as data preprocessing before feature engineering. Conditional dependencies execute steps based on specific criteria or conditions, like querying a model only if the dataset in the pipeline is done being ingested. Data availability dependencies ensure that a step starts only when the necessary data or inputs are available from a previous step, ensuring that model training waits for the completion of feature engineering.

Resource-based dependencies manage the execution of steps based on the availability of computational resources, optimizing performance by scheduling tasks when required resources such as CPU or GPU are available. Concurrency constraints allow for the parallel execution of multiple steps while respecting dependencies, improving pipeline efficiency by running non-dependent tasks simultaneously, such as running data ingestion and initial data cleaning in parallel. Time-based dependencies schedule steps to execute at specific times or intervals, suitable for pipelines requiring periodic updates, like running data ingestion every night at midnight.

Error handling dependencies define the pipeline's response to errors or failures in specific steps, incorporating retry policies, fallback procedures, or stopping the pipeline. Manual approval dependencies ensure that critical stages requiring human oversight proceed only after receiving manual approval, such as deploying a trained model to production after successful evaluation and team lead approval. These dependency policies, implemented through configuration files, workflow orchestrators, and visual interfaces, help create robust, efficient AI pipelines capable of handling complex workflows by clearly defining the interactions and prerequisites for each step.

At stage 1638, the pipeline definition is updated to reflect the dependencies. This can include adding the dependencies to the pipeline manifest. The dependency can be identified in the manifest in connection with the step (e.g., pipeline object) that has the dependency.

The validation service can then validate the updated pipeline manifest at stage 1642. This can include ensuring that the manifest adheres to required formats, contains valid configurations, and meets predefined standards for successful execution. This process can include multiple layers of validation to ensure both syntactic correctness and functional integrity.

Firstly, the syntax validation checks that the manifest file conforms to the expected schema, which can be defined using tools like JSON Schema or YAML Schema. This involves verifying that all required fields are present, data types are correct, and the structure of the manifest is as expected. Format checking and linting are also part of this step to enforce coding standards and detect common formatting errors.

Secondly, semantic validation ensures the manifest's content makes logical sense. This involves checking that all referenced components, such as data sources, preprocessing steps, and models, are defined and available to the tenant. It also includes validating that the specified parameters and configurations are within acceptable ranges and types. Additionally, dependency resolution ensures that the sequence of steps respects the required order and that all necessary prerequisites are met. This process can simulate the pipeline execution to identify any issues before actual deployment.

Security validation ensures that sensitive information is managed correctly, and access controls are properly configured. This includes verifying that credentials, API keys, and other sensitive data are securely handled and not exposed in the manifest. The validation results can be displayed.

When the AI pipeline is loaded in the UI, at stage 1644 the UI can request a pipeline definition from the builder service. The builder service can generate and return the manifest and an API endpoint at stage 1646.

The user can modify the AI pipeline in the UI at stage 1648. When the user saves the modification, the builder service can rearrange the manifest at stage 1659. The modified manifest is validated by the validation service at stage 1652.

The UI can then test the pipeline, such as in a playground, battlefield, or QA environment at stage 1654. At stage 1656, the evaluation service executes pipeline tests. Comprehensive validation, including testing and dry runs, ensures that the AI pipeline is ready for execution, reducing the risk of errors and ensuring robust and reliable pipeline operation.

The pipeline tests can include running a batch of inputs and comparing the outputs to expected outputs. The comparison can be a semantic comparison based on vectorizing the output and performing a vector comparison to a vectorized expected output. Alternatively, and LLM can compare the results to expected results and alert an administrator to divergence. The test results can display in the UI at stage 1658.

Figure 17:
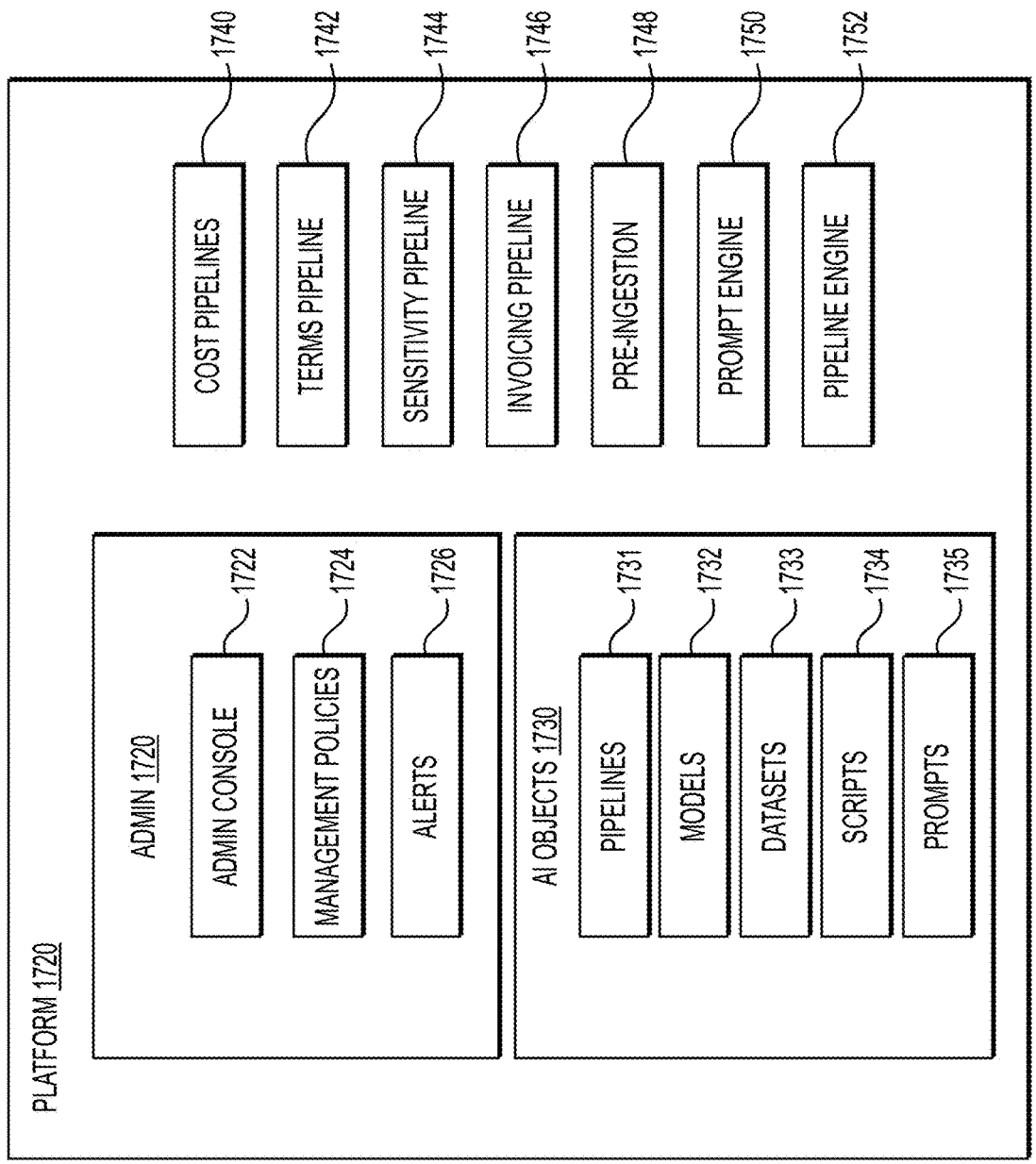
FIG. 17 is an illustration of system components for administration aspects of an AI platform application, according to various embodiments.

FIG. 17 is an illustration of system components for administration aspects of an AI platform 1710, according to various embodiments. The AI platform 1710 can include various administrative pipelines for determining the costs of AI services, the information sensitivities of pipelines, and invoicing, among other administrative features. Pre-ingestion tools and prompt engines ensure that the AI pipelines continue to operate with minimal disruption, as will be explained.

Administrative features 1720 can include an admin console 1722, management policies 1724, and alerts 1726. The admin console 1722 can include the previously described UI for designing and testing AI pipelines. AI objects 1730 are pictured for this purpose, with pipelines 1731, AI models 1732, AI datasets 1733, code 1734, and prompts 1735 all being available for inclusion in the pipeline design.

The administrative console can operate in at least two modes. A first mode is a Developer version. This can be useful to software developers, since the Develop version includes deep debugging capabilities. A second version is tailored towards laymen. The Layman version avoids presenting information at a code level, and instead provides concepts that are understandable and that get translated to particular code and parameters based on selections the user makes.

The administrative features of the AI platform can determine what is permitted at various third-party models and what is the cost both now and in the future. With this information compared to requirements for the AI pipeline, the pipeline engine 1752 can determine when and wear to execute some stages of an AI pipeline. Additionally, invoicing can occur automatically based on the costs of running the AI pipeline.

An administrator can set management policies 1724, such as pipeline policies, that define cost and timing boundaries of an AI pipeline's operation.

The AI pipeline can operate either synchronously or asynchronously. Synchronous operation runs upon receipt of an input to the pipeline. However, asynchronous pipelines run independently of an input, and instead can wait for a different triggering condition. For example, a customer might not care when a large image manipulation job occurs, so long as it is within a threshold number of hours. This can allow for flexibility in where the job runs, such as in a low cost market overnight to save money.

To surface infrastructure costs, a cost pipeline 1740 asynchronously executes at the AI platform 1710. The cost pipeline 1740 can periodically poll hyperscalers to determine costs currently and historically at different times. A hyperscaler can be a large-scale cloud service provider that offers extensive and scalable infrastructure for computing, storage, and networking. These hyperscalers, such as Amazon Web Services (AWS), Microsoft Azure, and Google Cloud Platform (GCP), are capable of supporting vast amounts of data and high-performance computing tasks required for AI workloads. They provide the necessary resources to deploy and manage complex AI models at scale.

Polling a hyperscaler to determine the costs of running an AI service can include querying the cloud service provider's pricing APIs to retrieve real-time pricing information for the resources utilized by the AI service. The process starts by identifying the specific resources required, such as compute instances, storage, data transfer, and specialized AI services like machine learning models or data preprocessing tools.

To perform the polling, the AI platform 1710 can authenticate with the hyperscaler's pricing API using appropriate credentials, such as API keys or tokens. Once authenticated, the pipeline engine 1752 can send requests to the pricing API, specifying the types and configurations of resources needed. These requests can be built into the cost pipeline 1740, in an example. The API responds with detailed cost information, including current prices for various resource types and any applicable discounts or usage tiers.

By storing historical pricing data, the cost pipeline 1740 can also forecast the likely cost of each AI service at various times during a day. This can allow the pipeline engine 1752 to schedule asynchronous AI pipelines based around the times with cheaper costs. In another example, the AI pipeline can allow flexibility in where to execute an AI service, such as an LLM. This can allow the cost pipeline 1740 to consider costs across all eligible AI services for an AI pipeline.

The system then aggregates this pricing data to calculate the total estimated cost of running the AI service. This involves summing up the costs of all individual resources over the expected usage duration. For a comprehensive cost estimate, the system may also factor in additional costs such as data ingress and egress, persistent storage, and any ancillary services. This aggregated cost information can be presented to users or system administrators to inform budgeting and resource allocation decisions.

Finally, the polling process can be automated to run at regular intervals, ensuring that cost estimates remain up to date with any changes in pricing or resource usage patterns. This continuous monitoring helps in managing and optimizing the operational expenses associated with running AI services on a hyperscaler platform.

As an example of cost awareness, GPU workloads on AWS can run $4.00/hour, but same hardware from smaller vendors can be had for $0.70/hour. The cost pipeline 1740 can continuously evaluate and lower cost for customers by choosing where to run their models, all things being otherwise equal, to achieve the lowest cost. The cost pipeline 1740 or pipeline engine 1752 can allow the both upon run of pipeline and throughout its execution switching to alternate execution environment upon a significant/threshold deviation from the current execution environment.

GPU workloads are most efficient when multi-thread operations are being executed, so making cost-aware decisions on how to sub-divide an entire processing load of a pipeline across X array of GPUs can have a significant impact on the total cost to run the pipeline (e.g., images are best run as batches as to optimize the cost when 1M images are run through a new, more capable model, as opposed to sequentially, as well as the optimal batch size being a significant factor in workload execution optimization)

A sensitivity pipeline 1744 can run at the AI platform 1710 to identify data sensitivity levels of customer pipelines and datasets. The sensitivity can be relevant because different pipeline objects may need to be suggested to ensure the data remains confidential. The sensitivity pipeline 1744 can review the prompts in a user's AI pipeline to determine what kind of information is being shared. Alternatively, the AI platform can ask the user can be asked questions about the pipeline or dataset, and based on those questions the pipeline or dataset can be labelled as sensitive.

Different AI services have different terms of service, making some AI services unsuitable for particular use cases. For example, a health application might violate terms of an AI service that forbids health applications. Because these terms change periodically, a terms pipeline 1742 can periodically execute and poll the eligible AI services for their terms of service.

High sensitivity pipelines can be more likely to violate terms of service. The terms of service pipeline 1742 or another process can surface conflicts with existing pipelines, in the form of alerts 1726. To determine if a terms of service changed, the service can be polled, the terms of service can be hashed and compared to a prior hash of the terms of service. If a difference exists, the AI platform can perform a semantic meaning comparison between the two versions of the terms of service. If the terms of service have become more or less restrictive with regard to any category of service, then the terms pipeline 1742 can re-compare against existing pipelines to reassess which AI pipelines are now allowed or disallowed based on the new terms of service.

Different providers have varying levels of restrictiveness in their terms of service. The terms pipeline 1742 can distill down the disallowed topics or topics that require approval prior to a pipeline using the provider. For example, health questions may be disallowed. The prompt engine 1750 can analyze user prompt packages to determine whether any pipelines are using the provider for health advice. If so, then an alert 1726 can be surfaced to an administrator.

In one example, AI platform can download and vectorize a terms of service. For example, the terms can be downloaded from a company website. The terms pipeline 1742 can then determine whether the terms are violated by the intended use of the AI pipeline. Based on the combination of eligible AI services with non-conflicting terms and with cost schedules in place, the pipeline engine 1752 can select an AI service and operation time. This allows for dynamically adjusting the execution of asynchronous AI pipelines to save money for the customer.

Additionally, a pipeline can be multithreaded to harness graphical processing unit (GPU) power better. This can particularly help with large jobs. For example, several threads, such as ten, can simultaneously run for image ingestion. In one example, the size or volume of the dataset can be used to determine whether to multithread the job.

Likewise, if a pipeline is taking too long to execute compared to polled data regarding execution times at another hyperscaler, the pipeline engine can stop execution and resume execution at the faster hyperscaler. Likewise, if another hyperscaler is polling with similar execution times but a lower price, the pipeline engine 1752 can switch the next portion of the workflow to the other hyperscaler. This can particularly be relevant for large batch jobs, such as processing a hundreds of gigabytes of images.

The pipeline engine 1750 can report each AI service that runs in the pipelines. The AI platform can track which AI service ran, when it ran, and the cost. Additionally, the platform can track what could have run and how much that would have cost.

An invoicing pipeline 1746 can use this tracked data to periodically tally a customer's current balance. Invoices can be created according to scheduled time periods. The cost savings of the dynamically scheduled asynchronous AI pipelines can be calculated and displayed on the invoice. For example, in addition to adding up line items about which services the customer used and how much that cost, the invoicing pipeline 1746 can sum up which services the customer could have run or even would have run without the platform's dynamic pipeline adjustments. The cost difference can be shown on the invoice, which helps the customer understand their overall savings by continuing to use the AI platform 1710.

The invoicing pipeline 1746 (also called billing pipeline) can calculate infrastructure consumption, such as compute and storage costs. The invoice itself can also be broken down by AI pipeline, in an example. The average costs of the AI pipelines during the billing period can be shown. Additionally, average costs of individual pipeline objects can be shown. This can allow the user to know how to tweak pipelines to lower costs.

In one example, the cost pipeline 1740 polls alternative prices at other hyperscalers. When another hyperscaler offers savings above a threshold as compared to a user's current configuration, an alert 1726 can be sent to the user. The user can review the per-day or per-hour cost difference. The user can decide whether to switch to the other hyperscaler. The user can also establish the cost threshold and select and option that authorizes the AI pipeline to pick the hyperscaler with the best price when the threshold is exceeded. The user can also be presented with an option of whether to apply this to asynchronous pipelines, synchronous pipelines, or both. In one example, the user can approve a list of potential hyperscalers. From this list, the cheapest hyperscalers can be selected by the AI pipeline.

In one example, a prompt engine 1750 can automate a battleground for an AI pipeline at multiple hyperscalers, including new hyperscalers that are not yet on the user's approved list. The prompt engine 1750 can use one or more conversations that are repeated at each hyperscaler. At each step of the conversation, the semantic similarity of the results can be analyzed by the prompt engine 1750. If the semantics diverge at a step, the prompt engine 1750 can request a new prompt for use at the new hyperscaler that will result in the conversation maintaining semantic similarity at the step where the semantic meaning diverged. The new prompt can be stored for use at that hyperscaler.

The battleground can be repeated, using the new prompt. If the semantic similarity remains the same through multiple battlegrounds, then the AI platform can indicate on the UI that the hyperscaler has been battleground tested. The UI can also indicate how many new prompts were created to maintain semantic similarity. The user can review the new prompts and decide whether to add the new hyperscaler to the approved list, along with the new prompts.

A pre-ingestion module 1748 can inspect new content that the user attempts to upload to the AI platform 1710 for ingestion. The AI platform can also include a marketplace where third parties can monetize and optionally deploy their pipeline modules (e.g., AI models, data sets, python scripts, identity provider hooks, etc.).

Management policies can dictate which users can purchase the pipeline modules, in an example. Additionally, a customer deposit or credit account can be charged. In one example, AI models and entire pipelines can be purchased and integrated into client pipelines and other workflows. The pipeline modules can incur a monthly charge, a per use charge, or any other payment configuration. Authorized users can implement the pipeline modules and payments can be deducted from the user account. The purchased pipeline modules can be tested in a battleground against existing AI models.

A prompt workbench engine, also called prompt engine 1750, can compare outputs from prompt packages on a single model or across different models. The user can request help guiding the AI model to a type of answer, and the AI platform can request that the model generate prompts that are likely to result in the user's desired output. The user can then test those prompts against an existing prompt package and continue refining the prompts accordingly.

The pipeline builder UI of the AI platform 1710 can track versions of a pipeline. This can allow an administrator user to make changes, such as to try a new AI model or now conditional parameters or management policies, and revert to a prior version of the AI pipeline if needed.

The pipeline builder UI can support if/then code blocks. This can allow the user to drag and drop conditions into the pipeline. The conditional block can include multiple And and OR conditions in an example. The conditions can be selected from any of the extensive parameters, management policies, and compliance settings discussed herein. For example, the pipeline path can split in any number of paths based on a conditional block that checks user group, user compliance, device configuration, network settings, object parameters, and any of the settings discussed herein. The AI platform 1710 can also periodically rotate API keys for the AI pipelines.

Figure 18:
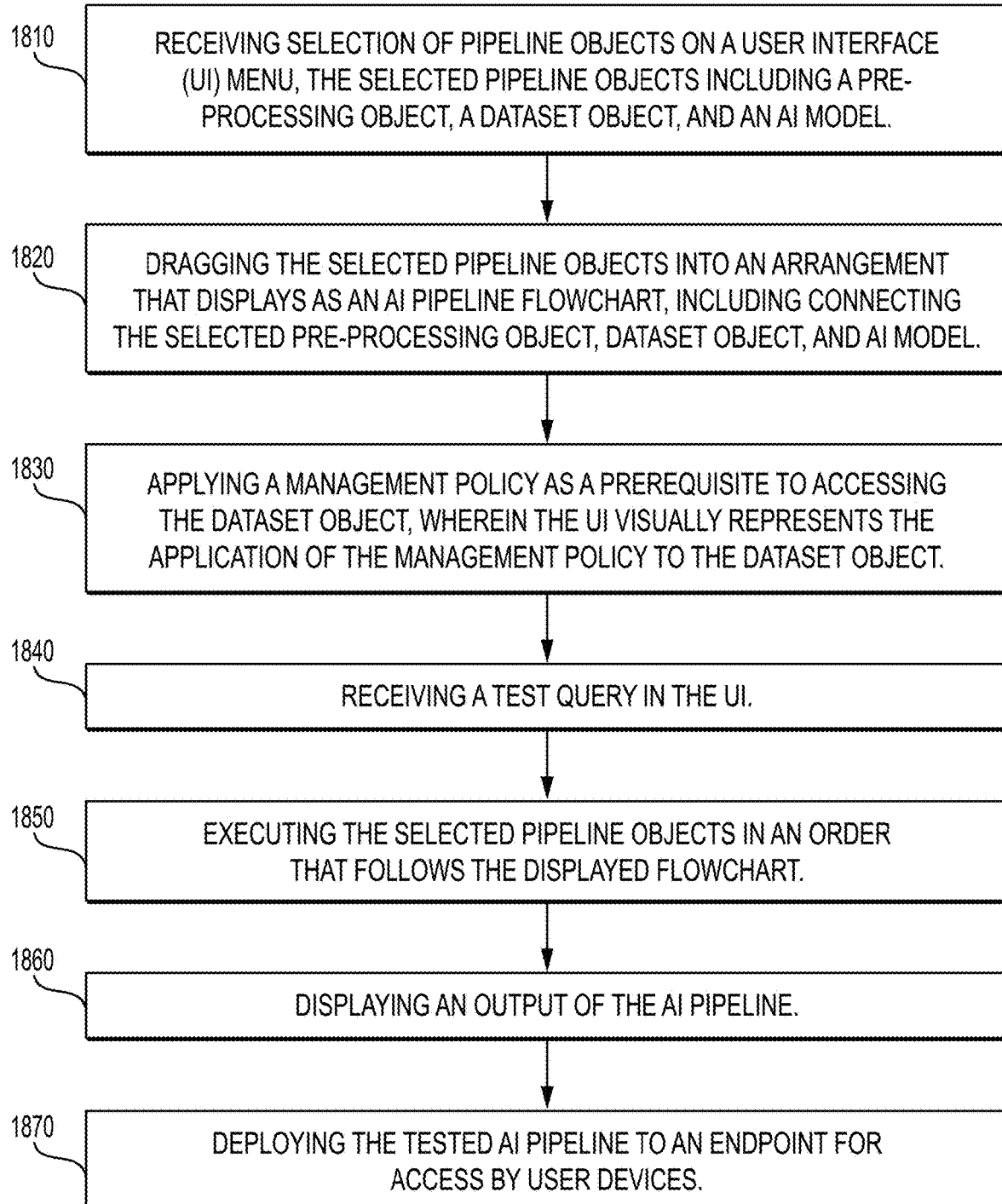
FIG. 18 is an example flow chart of a method for creating an AI pipeline that includes management policies.

FIG. 18 is an example flow chart of a method for creating an AI pipeline that includes management policies. The AI pipeline platform can execute on a server. A user can access the platform with a user device, either through an application that executes on the user device or through a web application. The platform can present a user interface (UI) with pipeline objects and tools for constructing an AI pipeline, which can display as a flow diagram on the UI.

At stage 1810, the server can receive a selection of pipeline objects on the UI, the selected pipeline objects including a dataset object and an AI model. The AI model can be a language model, such as a small language model or large language model.

At stage 1820, the server can receive further inputs to the UI to arrange the selected pipeline objects in an AI pipeline. For example, the pipeline objects can be dragged into position and connected to one another. The connection causes an execution linking between the selected dataset object and AI model to be established. The UI visually represents the established execution linking between the pipeline objects. The system can generate a pipeline manifest file that stores the arrangement of pipeline objects in the AI pipeline. When the manifest is validated, the AI pipeline is displayed as an execution flow within the UI. Validating the manifest can include checking the pipeline objects against dependency rules (also called dependency policies). Dependency rules dictate events that must occur before at least one of the selected pipeline objects can execute. These can be the execution of other pipeline objects or external dependencies, such as the loading of a library. The UI can display a validation of the pipeline manifest.

At stage 1830, the system can also cause a management policy to be applied to the dataset object. The management policy can ensure that a user meets compliance requirements as a prerequisite for accessing the dataset object through execution of the AI pipeline. For example, if the user device does not have compliant settings, applications, or a geofenced location, the dataset can be inaccessible as part of the pipeline execution. This can be a useful wat to protect datasets that include sensitive or enterprise information. The management policy can be selected from multiple predefined policies, with a conditional code block dictating what to do when various compliance levels are achieved. In one example, the management policy requires that an end user attempting to access the AI application is authorized to access the dataset object based at least in part on the end user being associated with an identifier of an authorized group and a client device of the end user being compliant with at least one pipeline end user policy. The client device of the end user can be a computing device through which the access to the AI application is attempted. The UI can visually represent the application of the management policy to the dataset object.

The designed AI pipeline can then be tested within the UI in a simulated execution. The user can select a testing option on the UI. At stage 1840, the user can input a test query or select a series of test queries for use in the simulated execution. Either way, the system can receive a test query in the UI. The query can be a text input or any other type of input, just depending on the AI pipeline design.

At stage 1850, the system then causes the selected pipeline objects to be executed in an order that follows the execution linking displayed within the UI. In one example, a pipeline engine executes that coordinates each step of the pipeline according to the pipeline objects and dependencies identified in the pipeline manifest. This can include calling third-party services to execute pipeline objects. For example, the pipeline engine can make API calls to a third-party language model, wait for results, and send the results as an input to the next pipeline object in the AI pipeline.

The test can also utilize simulated or actual user profiles and compliance information. For example, test users with profile and compliance information, such as device compliance information, can be selected as the source of the input query.

The pipeline engine can execute each stage of the pipeline until the output is reached. Alternatively, if there is a timeout or a pipeline policy is violated, the pipeline engine can end execution. For example, a pipeline policy can specify a maximum cost or maximum number of calls to a AI model, and if the test exceeds one of the maximums the pipeline engine can terminate the pipeline execution.

At stage 1860, the system can then cause an output of the simulated execution to be displayed in the UI based on the test query. This can include displaying the output in a window within the GUI. In one example, multiple outputs are displayed next to the corresponding input queries.

At stage 1870, the administrator can deploy the tested AI pipeline by selecting a deployment option. In one example, the AI platform tracks various versions of an AI pipeline. Only one version is active and deployed at a given time. When the pipeline is being tested, either initially or for potential modification, it can be given a version number. Then, when the tested AI pipeline is set to active (e.g., deployed), the version identifier is stored as the active version. As an example, the example manifest included in the discussion of FIG. 15 includes the pipeline ID: 6b2daba2-cdab-4ef8-99fc-98c70f70d41c. Upon activation/deployment, that pipeline ID can be set to the active ID.

Subsequently, when an application or user device accesses an endpoint associated with the AI pipeline, the pipeline engine can select the active pipeline ID for execution. This allows for storing prior versions of a pipeline and activating a pipeline as part of deployment. The endpoint, including an access key, can be distributed to applications on user devices, allowing the application to interact with the deployed AI pipeline.

The pipeline builder UI can also implement administrative user policies in determining which pipeline objects are available to the administrative user. For example, prior to displaying the selected pipeline objects, the system can determine compliance of a computing device through which the UI is displayed. Particular management policies can be related to the administrator user, including at least one pipeline administrative user policy. For example, certain network security can be required, the administrator user might need to use a pre-approved user device, or the administrative user might need to be located inside or outside of a particular geofence. Compliance with the pipeline administrative user policy can be determined at least in part on information received from an AI management agent that executes on the computing device.

In one example, prior to displaying the available pipeline objects that get selected in the UI, the method further comprises authenticating the administrator based on a user identifier and a tenant identifier. The tenant identifier can be customer specific. The administrator might belong to only one tenant, or could have different access levels across different tenants. This step can allow for differentiating available pipeline objects between different administrative users, with tenants including different customers of the AI platform or of some other enterprise. The selected pipeline objects are selected from a displayed menu that includes AI model prompts, datasets, AI models, and executable code objects. One of the executable code objects is a conditional object that allows user selection of an if-then statement for at least two branches within the AI pipeline.

Find and replace code objects can be used in the AI pipelines. This can allow for easy pre- or post-processing. In one example, the user or tenant can maintain a list of words to replace, with alternatives. The find and replace object can utilize one or more selected lists. A dynamic mode can be used for replacing names that are recognized. The list can mention types of words, such as "names," "slurs," "personal information," and the find and replace block can replace those word types.

Vectorizers and embedders are objects that convert text into numerical representations (vectors) that machine learning models can use. Examples include Count Vectorizer, TfidfVectorizer from scikit-learn, Word2Vec from gensim, and pre-trained transformers like BERT. Additionally, lemmatizers and stemmers, such as WordNetLemmatizer and PorterStemmer from nltk, reduce words to their base or root forms, helping normalize the text for analysis.

An external dependency object is another pipeline object available in the Pipeline Builder UI. The object can list one or more dependencies that a pipeline engine should wait on prior to executing a pipeline object. The external dependency can include the ingestion of content by an external service. Any dependency rule can be included in the dependency object.

External dependencies can encompass the various libraries, frameworks, and services that the pipeline relies on to function correctly. These dependencies include widely used libraries such as TensorFlow, PyTorch, and scikit-learn, which provide essential tools for building and deploying machine learning models. Beyond libraries, external dependencies also involve cloud services and APIs that facilitate data storage, processing power, and model deployment. Platforms like Amazon Web Services (AWS), Google Cloud Platform (GCP), and Microsoft Azure offer scalable infrastructure that supports large-scale data processing and model training. These services often include specialized AI and machine learning tools that can accelerate development and deployment. However, reliance on these external services introduces considerations such as cost, latency, data privacy, and security, all of which can impact the overall effectiveness and feasibility of the AI pipeline.

The UI can also include an option to define pipeline execution location. For example, the pipeline can execute on-premises or in an SaaS configuration, such as with a cloud connector. A pipeline scheduler can be a process that schedules when a pipeline will run, causing execution of the pipeline at that time. Some pipelines can be triggered by an event, such as by receiving an input. These and other pipelines, particularly asynchronous pipelines, can be scheduled for execution. The schedule can be a one-time execution or a periodic execution.

In one example, the polling of the cost pipeline 1740 allows the AI platform to determine that an asynchronous pipeline will run more cheaply at a later time that is still within the acceptable execution window. The AI platform can schedule the pipeline to execute at that later time through use of the pipeline scheduler.

The UI can also include pipeline export and import functions. All pipeline objects can require passwords to be typed in again before they become usable.

The UI can allow the user to specify dataset subobjects and parameters. In the context of an AI pipeline, dataset subobjects can be individual elements that define how the dataset is handled, processed, and utilized. These subobjects help break down the complex task of dataset management into manageable pieces, each responsible for a specific aspect of the data workflow.

The Embedding Model subobject defines how text data is transformed into numerical vectors that can be used by machine learning models. This subobject might allow users to choose from various pre-trained models (e.g., Word2Vec, GloVe, BERT) or to specify custom embeddings. The embedding model determines the representation of the text data, which is critical for the performance of NLP tasks.

A vector stores parameter provide options for users to select or define the storage mechanism for the vectors generated by the embedding model. This could include choices like in-memory storage, databases, or specialized vector stores like FAISS. The user interface would allow configuration of the storage parameters, ensuring that the vectors can be efficiently retrieved and utilized in the pipeline.

Chunking parameters enable users to define how large datasets should be divided into smaller, manageable chunks for processing. The UI can include options for specifying chunk sizes and strategies for chunking, ensuring smooth and efficient data processing.

A data sources parameter allows users to specify and configure the sources of the data being used in the pipeline. Options could include file uploads, database connections, API endpoints, or streaming data sources. The user interface can provide fields and options for entering the necessary connection details and credentials, making it easy to integrate diverse data sources into the pipeline.

An API Keys Object can allow users to securely input and manage API keys required for accessing external services and resources. This section can provide fields for entering keys, options for naming them, and managing their scope and permissions. It could also include features for securely storing and retrieving these keys during the pipeline execution, ensuring that sensitive information is protected while maintaining the functionality of the pipeline.

A memory object in the user interface can enable users to configure memory management aspects of the AI pipeline. This can involve setting up cache mechanisms, defining memory limits, and selecting memory storage options. The interface can offer sliders, input fields, and drop-down menus to adjust memory settings and optimize the performance of the pipeline, ensuring efficient handling of data and intermediate results without exceeding available system resources.

A webhook is a mechanism for automatically sending real-time data or notifications from one system to another whenever certain events occur. Unlike traditional APIs, where a client needs to periodically poll the server to check for new data, webhooks enable the server to send data to the client immediately when the event happens. This makes webhooks more efficient and responsive for certain use cases.

In this case, the webhook sends changes regarding federal aviation rules (FAR) and an aeronautical information manual (AIM), but these are just content examples. Each has its own pipeline path, with FAR being recursively chunked, such as for a vector search, and then relevant data chunks are sent to different LLMs.

Different chunking techniques have been selected. Recursive chunking and semantic chunking are two distinct approaches to dividing data into smaller, manageable pieces for processing in AI and machine learning pipelines. Recursive chunking focuses on the structural aspects of data, repeatedly breaking it down into smaller chunks until each piece is of a manageable size. This method does not consider the content or meaning of the data, making it suitable for scenarios where data size and structure are the primary concerns. For instance, a large document might be recursively divided into sections, paragraphs, and sentences to ensure it fits into memory constraints and can be processed in parallel.

In contrast, semantic chunking involves dividing data based on its meaning or semantic content. This method ensures that each chunk is a coherent unit of information that makes sense on its own, which is important in natural language processing tasks. Semantic chunking maintains the integrity of the context within each chunk, making it suitable for applications like text summarization, question answering, and document clustering. For example, a document might be divided into sections based on topics or themes, with further divisions based on subtopics or logical units of meaning.

Recursive chunking can be used in preprocessing stages where the primary goal is to handle large volumes of data efficiently. It ensures that the data is split into uniform, smaller parts that can be processed independently. This method is beneficial when the focus is on data size and structure rather than the preservation of meaning, making it ideal for scenarios where computational efficiency is paramount. On the other hand, semantic chunking is effective for tasks that require comprehension and preservation of the meaning within each chunk.

In an AI pipeline builder user interface, users might select recursive chunking when the objective is to preprocess large datasets for machine learning training. This choice ensures efficient handling of data by breaking it into manageable pieces without considering the content's meaning. Conversely, users might opt for semantic chunking for tasks that require natural language understanding and generation, as this method preserves the contextual and semantic coherence of the data.

Pipeline management rules can enforce personal data privacy. In one example, endpoint device filtering can effectuate PII redaction and filter sensitive content so it never leaves the user's computing device 140. Pipeline management rules can trigger the blurring of text in photos containing SSN's, credit card numbers, bank account numbers, prescription numbers, names, addresses, and more. Similarly, the a pipeline can blur sensitive information recognized in video. Functions can be added to blur faces. A setting can be selected for whether the blur applies to all people, specific people, kids only, or more specific requirements.

To implement split pipelines, the UI could provide options to define branching logic, enabling users to specify conditions under which the pipeline splits into different paths. This can be useful for handling different types of data or processing requirements within the same overarching pipeline.

Furthermore, the UI can incorporate functionality to assign specific pipeline segments to be executed on endpoint devices. This can be achieved by allowing users to tag certain blocks or sections of the pipeline with an "endpoint execution" label. These labeled sections would include preprocessing steps, lightweight model inference, or any operations that benefit from being closer to the data source to reduce latency or bandwidth usage. The UI could offer settings for each block, where users can specify the target environment for execution—whether it be a centralized server, cloud infrastructure, or an endpoint device such as a mobile phone or IoT device.

To enhance usability, the pipeline builder UI might include visualization tools that clearly delineate which parts of the pipeline are executed locally versus on the endpoint. For example, it could use different colors or icons to represent server-side and endpoint-side processing. Additionally, the UI could provide validation checks and performance estimation features to ensure that the designated endpoint segments are feasible given the computational constraints of the endpoint devices. By integrating these capabilities, the UI not only empowers users to create efficient and flexible AI pipelines but also ensures that the deployment strategy is optimized for the specific requirements of each segment of the pipeline.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module," a "system," or a "computer." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

What is claimed is:

1. A method of creating an artificial intelligence (AI) pipeline, comprising:
   receiving a selection of pipeline objects on a user interface (UI), the selected pipeline objects including a dataset object and an AI model, wherein the dataset object includes at least one vector database;
   receiving inputs to the UI to arrange the selected pipeline objects in an AI pipeline, including causing an execution linking between the selected dataset object and the AI model to be established, wherein the UI visually represents the established execution linking between the pipeline objects, wherein the pipeline objects are moveable within the UI by a user, and wherein the AI pipeline is displayed as an execution flow within the UI,
   wherein establishing the execution linking between the selected dataset object and AI model comprises validating that outputs from the selected dataset object can be used as inputs to the AI model;
   causing a management policy to be applied to the dataset object, compliance with the management policy being a prerequisite for accessing the dataset object through an execution of the AI pipeline, wherein the UI visually represents the application of the management policy to the dataset object,
   wherein enforcing the management policy includes verifying at least one of device location and a device security state based on a profile, and wherein the AI pipeline includes a conditional execution alternative based on noncompliance with the management policy;
   causing a simulated execution of the AI pipeline to be displayed within the UI, including:

receiving a query in the UI;
receiving compliance information;
causing the selected pipeline objects to be executed in an order that follows the execution linking displayed within the UI and applies the management policy based on the compliance information; and
causing an output of the simulated execution to be displayed in the UI; and
causing the AI pipeline to be deployed, wherein the deployed AI pipeline is accessible by at least one AI application through a generated endpoint.

2. The method of claim 1, wherein causing the execution linking between the selected dataset object and AI model to be established comprises causing a pipeline manifest file to be generated which stores the arrangement of pipeline objects in the AI pipeline.

3. The method of claim 2, further comprising:
validating the pipeline manifest against a dependency rule, wherein the dependency rule dictates an event that must occur before at least one of the selected pipeline objects can execute; and
displaying, within the UI, a validation of the pipeline manifest.

4. The method of claim 1, wherein the method further comprises, prior to displaying the selected pipeline objects, determining that a computing device through which the UI is displayed is compliant with at least one pipeline administrative user policy, wherein compliance with the pipeline administrative user policy is determined at least in part on information received from a management agent that executes on the computing device.

5. The method of claim 1, wherein prior to displaying the selected pipeline objects in the UI, the method further comprises authenticating the user based on a user identifier and a tenant identifier.

6. The method of claim 1, wherein the selected pipeline objects are selected from a displayed menu that includes at least one of AI model prompts, datasets, AI models, and executable code objects, and wherein one of the executable code objects is a conditional object that allows user selection of an if-then statement for at least two branches within the AI pipeline.

7. The method of claim 1, wherein the management policy requires that an end user attempting to access the AI application is authorized to access the dataset object based at least in part on the end user being associated with an identifier of an authorized group and a client device of the end user being compliant with at least one pipeline end user policy, the client device of the end user being a computing device through which the attempt to access the AI application is attempted.

8. A non-transitory, computer-readable medium including instructions are executed by a processor and cause the processor to perform stages for creating an artificial intelligence (AI) pipeline, the stages comprising:
receiving a selection of pipeline objects on a user interface (UI), the selected pipeline objects including a dataset object and an AI model, wherein the dataset object includes at least one vector database;
receiving inputs to the UI to arrange the selected pipeline objects in an AI pipeline, including causing an execution linking between the selected dataset object and AI model to be established, wherein the UI visually represents the established execution linking between the pipeline objects, wherein the pipeline objects are moveable by a user within the UI, and wherein the AI pipeline is displayed as an execution flow within the UI,
wherein establishing the execution linking between the selected dataset object and AI model comprises validating that outputs from the selected dataset object can be used as inputs to the AI model;
causing a management policy to be applied to the dataset object, compliance with the management policy being a prerequisite for accessing the dataset object through an execution of the AI pipeline, wherein the UI visually represents the application of the management policy to the dataset object,
wherein enforcing the management policy includes verifying at least one of device location and a device security state based on a profile, and wherein the AI pipeline includes a conditional execution alternative based on noncompliance with the management policy;
causing a simulated execution of the AI pipeline to be displayed within the UI, including:
receiving a query in the UI;
receiving compliance information;
causing the selected pipeline objects to be executed in an order that follows the execution linking displayed within the UI and applies the management policy based on the compliance information; and
causing an output of the simulated execution to be displayed in the UI; and
causing the AI pipeline to be deployed, wherein the deployed AI pipeline is accessible by at least one AI application through a generated endpoint.

9. The non-transitory, computer-readable medium of claim 8, wherein causing the execution linking between the selected dataset object and AI model to be established comprises causing a pipeline manifest file to be generated which stores the arrangement of pipeline objects in the AI pipeline.

10. The non-transitory, computer-readable medium of claim 9, the stages further comprising:
validating the pipeline manifest against a dependency rule, wherein the dependency rule dictates an event that must occur before at least one of the selected pipeline objects can execute; and
displaying, within the UI, a validation of the pipeline manifest.

11. The non-transitory, computer-readable medium of claim 8, wherein the stages further comprise, prior to displaying the selected pipeline objects, determining that a computing device through which the UI is displayed is compliant with at least one pipeline administrative user policy, wherein compliance with the pipeline administrative user policy is determined at least in part on information received from a management agent that executes on the computing device.

12. The non-transitory, computer-readable medium of claim 8, wherein prior to displaying the selected pipeline objects in the UI, the stages further comprise authenticating the user based on a user identifier and a tenant identifier.

13. The non-transitory, computer-readable medium of claim 8, wherein the selected pipeline objects are selected from a displayed menu that includes at least one of AI model prompts, datasets, AI models, and executable code objects, and wherein one of the executable code objects is a conditional object that allows user selection of an if-then statement for at least two branches within the AI pipeline.

14. The non-transitory, computer-readable medium of claim 8, wherein the management policy requires that an end user attempting to access the AI application is authorized to access the dataset object based at least in part on the end user being associated with an identifier of an authorized group and a client device of the end user being compliant with at least one pipeline end user policy, the client device of the end user being a computing device through which the attempt to access the AI application is attempted.

15. A system for creating an artificial intelligence (AI) pipeline, comprising:
   a memory storage including a non-transitory, computer-readable medium comprising instructions; and
   a hardware-based processor that executes the instructions to carry out stages comprising:
      receiving a selection of pipeline objects on a user interface (UI), the selected pipeline objects including a dataset object and an AI model, wherein the dataset object includes at least one vector database;
      receiving inputs to the UI to arrange the selected pipeline objects in an AI pipeline, including causing an execution linking between the selected dataset object and AI model to be established, wherein the UI visually represents the established execution linking between the pipeline objects, wherein the pipeline objects are moveable by a user within the UI, and wherein the AI pipeline is displayed as an execution flow within the UI,
         wherein establishing the execution linking between the selected dataset object and AI model comprises validating that outputs from the selected dataset object can be used as inputs to the AI model;
      causing a management policy to be applied to the dataset object, compliance with the management policy being a prerequisite for accessing the dataset object through an execution of the AI pipeline, wherein the UI visually represents the application of the management policy to the dataset object,
         wherein enforcing the management policy includes verifying at least one of device location and a device security state based on a profile, and wherein the AI pipeline includes a conditional execution alternative based on noncompliance with the management policy;
      causing a simulated execution of the AI pipeline to be displayed within the UI, including:
         receiving a query in the UI;
         receiving compliance information;
         causing the selected pipeline objects to be executed in an order that follows the execution linking displayed within the UI and applies the management policy based on the compliance information; and
         causing an output of the simulated execution to be displayed in the UI; and
      causing the AI pipeline to be deployed, wherein the deployed AI pipeline is accessible by at least one AI application through a generated endpoint.

16. The system of claim 15, wherein causing the execution linking between the selected dataset object and AI model to be established comprises causing a pipeline manifest file to be generated which stores the arrangement of pipeline objects in the AI pipeline.

17. The system of claim 16, the stages further comprising:
   validating the pipeline manifest against a dependency rule, wherein the dependency rule dictates an event that must occur before at least one of the selected pipeline objects can execute; and
   displaying, within the UI, a validation of the pipeline manifest.

18. The system of claim 15, wherein the stages further comprise, prior to displaying the selected pipeline objects, determining that a computing device through which the UI is displayed is compliant with at least one pipeline administrative user policy, wherein compliance with the pipeline administrative user policy is determined at least in part on information received from a management agent that executes on the computing device.

19. The system of claim 15, wherein prior to displaying the selected pipeline objects in the UI, the stages further comprise authenticating the user based on a user identifier and a tenant identifier.

20. The system of claim 15, wherein the selected pipeline objects are selected from a displayed menu that includes at least one of AI model prompts, datasets, AI models, and executable code objects, and wherein one of the executable code objects is a conditional object that allows user selection of an if-then statement for at least two branches within the AI pipeline.

* * * * *